(12) United States Patent
Fountain, Jr. et al.

(10) Patent No.: US 12,191,234 B2
(45) Date of Patent: Jan. 7, 2025

(54) INTEGRATED COOLING ASSEMBLIES FOR ADVANCED DEVICE PACKAGING AND METHODS OF MANUFACTURING THE SAME

(71) Applicant: Adeia Semiconductor Bonding Technologies Inc., San Jose, CA (US)

(72) Inventors: Gaius Gillman Fountain, Jr., Youngsville, NC (US); Belgacem Haba, Saratoga, CA (US); Kyong-Mo Bang, Fremont, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/235,271

(22) Filed: Aug. 17, 2023

(65) Prior Publication Data
US 2024/0387322 A1    Nov. 21, 2024

Related U.S. Application Data

(60) Provisional application No. 63/467,274, filed on May 17, 2023.

(51) Int. Cl.
*H01L 23/473*    (2006.01)
*H01L 21/48*    (2006.01)
(Continued)

(52) U.S. Cl.
CPC ........ *H01L 23/473* (2013.01); *H01L 21/4817* (2013.01); *H01L 21/4882* (2013.01);
(Continued)

(58) Field of Classification Search
CPC .................................................. H01L 23/473
See application file for complete search history.

(56) References Cited

U.S. PATENT DOCUMENTS 4,274,479 A    6/1981    Eastman
4,323,914 A *  4/1982    Berndlmaier ....... H01L 23/3121
                                                 257/E23.125
(Continued)

FOREIGN PATENT DOCUMENTS

CN    109524373 A    3/2019
CN    106911058 B    2/2020
(Continued)

OTHER PUBLICATIONS

Evan G. Colgan, "A Practical Implementation Of Silicon Microchannel Coolers", available online at <https://www.electronics-cooling.com/2007/11/a-practical-implementation-of-silicon-microchannel-coolers/>, Nov. 1, 2007, 10 pages.
(Continued)

*Primary Examiner* — William A Harriston
(74) *Attorney, Agent, or Firm* — HALEY GUILIANO LLP

(57) ABSTRACT

A device package comprising an integrated cooling assembly. The integrated cooling assembly comprises a semiconductor device and a cold plate attached to the semiconductor device. The cold plate comprises a top portion and a bottom portion horizontally adjacent to the top portion. The top portion comprises upper cavity dividers extending downwardly to define upper cavity volumes. The bottom portion comprises lower cavity dividers extending upwardly to define lower cavity volumes. The upper cavity dividers and the lower cavity dividers alternate across a horizontal length of the cold plate.

24 Claims, 12 Drawing Sheets

(51) Int. Cl.
*H01L 23/427* (2006.01)
*H01L 23/467* (2006.01)
*H01L 25/18* (2023.01)
*H01L 23/00* (2006.01)
*H10B 80/00* (2023.01)

(52) U.S. Cl.
CPC .......... *H01L 23/427* (2013.01); *H01L 23/467* (2013.01); *H01L 24/16* (2013.01); *H01L 24/32* (2013.01); *H01L 24/73* (2013.01); *H01L 25/18* (2013.01); *H01L 2224/16225* (2013.01); *H01L 2224/32225* (2013.01); *H01L 2224/73204* (2013.01); *H10B 80/00* (2023.02)

(56) References Cited

U.S. PATENT DOCUMENTS

| | | | |
|---|---|---|---|
| 5,309,986 A | 5/1994 | Itoh | |
| 5,522,452 A | 6/1996 | Mizuno et al. | |
| 5,769,154 A * | 6/1998 | Adkins | F28D 15/04 |
| | | | 126/96 |
| 6,056,044 A | 5/2000 | Benson et al. | |
| 6,294,408 B1 * | 9/2001 | Edwards | H01L 23/42 |
| | | | 438/118 |
| 6,351,384 B1 * | 2/2002 | Daikoku | F28F 13/12 |
| | | | 361/689 |
| 6,686,532 B1 | 2/2004 | MacRis | |
| 6,822,326 B2 | 11/2004 | Enquist et al. | |
| 6,867,973 B2 * | 3/2005 | Chang | G06F 1/203 |
| | | | 174/15.1 |
| 7,289,326 B2 | 10/2007 | Heydari et al. | |
| 7,294,926 B2 * | 11/2007 | Schubert | H01L 23/473 |
| | | | 361/689 |
| 7,485,957 B2 | 2/2009 | Brandenburg et al. | |
| 7,511,372 B2 | 3/2009 | Chiu | |
| 7,523,617 B2 | 4/2009 | Venkatasubramanian et al. | |
| 7,578,338 B2 * | 8/2009 | Yeh | F28D 15/046 |
| | | | 165/104.21 |
| 7,622,324 B2 | 11/2009 | Enquist et al. | |
| 7,692,926 B2 | 4/2010 | Henderson et al. | |
| 7,957,137 B2 | 6/2011 | Prasher | |
| 7,978,473 B2 | 7/2011 | Campbell et al. | |
| 7,997,087 B2 | 8/2011 | Venkatasubramanian et al. | |
| 8,042,606 B2 * | 10/2011 | Batty | F28F 13/187 |
| | | | 165/104.33 |
| 8,164,169 B2 | 4/2012 | Chrysler et al. | |
| 8,356,657 B2 * | 1/2013 | Zhao | F28D 15/046 |
| | | | 428/34.4 |
| 8,630,091 B2 | 1/2014 | Ward et al. | |
| 9,096,927 B2 * | 8/2015 | West | H01J 37/3414 |
| 9,131,631 B2 * | 9/2015 | Joshi | H01L 23/4735 |
| 9,224,673 B2 | 12/2015 | Chen et al. | |
| 9,263,366 B2 * | 2/2016 | Lin | H01L 21/4803 |
| 9,299,641 B2 | 3/2016 | Sekar et al. | |
| 9,355,932 B2 | 5/2016 | Ankireddi et al. | |
| 9,391,143 B2 | 7/2016 | Tong et al. | |
| 9,553,071 B1 | 1/2017 | Haba | |
| 9,711,433 B2 * | 7/2017 | Taniguchi | H01L 21/30625 |
| 9,741,638 B2 | 8/2017 | Hsieh et al. | |
| 9,741,696 B2 | 8/2017 | Katkar et al. | |
| 9,746,248 B2 | 8/2017 | Semenov et al. | |
| 9,768,149 B2 | 9/2017 | Vadhavkar et al. | |
| 9,818,723 B2 | 11/2017 | Haba | |
| 10,032,695 B2 | 7/2018 | Iyengar et al. | |
| 10,083,934 B2 | 9/2018 | Haba | |
| 10,157,818 B2 | 12/2018 | Chen et al. | |
| 10,170,392 B2 | 1/2019 | Chainer et al. | |
| 10,199,356 B2 | 2/2019 | Kinsley | |
| 10,312,221 B1 | 6/2019 | Agarwal et al. | |
| 10,332,823 B2 | 6/2019 | Chen et al. | |
| 10,461,059 B2 | 10/2019 | Koopmans et al. | |
| 10,694,641 B2 | 6/2020 | Basu et al. | |
| 10,744,603 B2 * | 8/2020 | Machler | F28F 3/048 |
| 10,978,427 B2 | 4/2021 | Li et al. | |
| 11,187,469 B2 | 11/2021 | Karesh | |
| 11,387,164 B2 | 7/2022 | Wu et al. | |
| 11,598,594 B2 | 3/2023 | Lewis et al. | |
| 11,758,691 B2 * | 9/2023 | Lin | H05K 3/282 |
| | | | 361/720 |
| 11,942,396 B2 * | 3/2024 | Chien | H01L 23/481 |
| 11,996,351 B2 | 5/2024 | Hsiao et al. | |
| 2002/0020518 A1 * | 2/2002 | Li | F28D 15/0233 |
| | | | 165/104.11 |
| 2003/0157782 A1 | 8/2003 | Kellar et al. | |
| 2004/0130874 A1 * | 7/2004 | Maveety | H01L 23/473 |
| | | | 257/E23.098 |
| 2004/0184237 A1 * | 9/2004 | Chang | G06F 1/20 |
| | | | 257/E23.098 |
| 2004/0251530 A1 | 12/2004 | Yamaji | |
| 2005/0126766 A1 | 6/2005 | Lee et al. | |
| 2005/0168947 A1 * | 8/2005 | Mok | H01L 23/427 |
| | | | 361/698 |
| 2005/0213301 A1 | 9/2005 | Prasher | |
| 2005/0280162 A1 * | 12/2005 | Mok | H01L 24/31 |
| | | | 257/E23.088 |
| 2006/0002088 A1 * | 1/2006 | Bezama | F28F 3/12 |
| | | | 257/E23.098 |
| 2006/0042825 A1 * | 3/2006 | Lu | F28D 15/0266 |
| | | | 257/E23.09 |
| 2006/0103011 A1 | 5/2006 | Andry et al. | |
| 2007/0025082 A1 * | 2/2007 | Lee et al. | H01L 23/3677 |
| | | | 257/E23.098 |
| 2007/0107875 A1 | 5/2007 | Lee et al. | |
| 2008/0096320 A1 | 4/2008 | Farrar | |
| 2009/0122491 A1 | 5/2009 | Martin et al. | |
| 2010/0116534 A1 | 5/2010 | Choi et al. | |
| 2010/0230805 A1 | 9/2010 | Refai-Ahmed | |
| 2010/0290188 A1 * | 11/2010 | Brunschwiler | H01L 25/0657 |
| | | | 361/699 |
| 2010/0300202 A1 | 12/2010 | Joyce | |
| 2011/0129986 A1 | 6/2011 | Libralesso et al. | |
| 2013/0044431 A1 | 2/2013 | Koeneman | |
| 2013/0050944 A1 | 2/2013 | Shepard | |
| 2013/0087904 A1 | 4/2013 | Clark et al. | |
| 2013/0248153 A1 * | 9/2013 | Sauciuc | H01L 23/467 |
| | | | 165/104.34 |
| 2014/0126150 A1 | 5/2014 | Song et al. | |
| 2014/0254099 A1 | 9/2014 | Takeda | |
| 2015/0194363 A1 | 7/2015 | Jun et al. | |
| 2016/0276314 A1 | 9/2016 | Ching et al. | |
| 2017/0012016 A1 | 1/2017 | Joshi et al. | |
| 2017/0092565 A1 | 3/2017 | Chen et al. | |
| 2017/0103937 A1 | 4/2017 | Hsieh et al. | |
| 2018/0053730 A1 | 2/2018 | Shao et al. | |
| 2018/0087842 A1 | 3/2018 | Chainer et al. | |
| 2018/0090427 A1 | 3/2018 | Bernstein et al. | |
| 2018/0160565 A1 | 6/2018 | Parida | |
| 2018/0211900 A1 | 7/2018 | Gutala et al. | |
| 2018/0308783 A1 | 10/2018 | Refai-Ahmed et al. | |
| 2019/0008071 A1 | 1/2019 | Kim | |
| 2019/0355706 A1 | 11/2019 | Enquist et al. | |
| 2019/0385928 A1 | 12/2019 | Leobandung | |
| 2019/0385933 A1 | 12/2019 | Eid et al. | |
| 2020/0035583 A1 | 1/2020 | Beauchemin et al. | |
| 2020/0049421 A1 * | 2/2020 | Wakaoka | F28D 15/04 |
| 2020/0105639 A1 | 4/2020 | Valavala et al. | |
| 2020/0312742 A1 | 10/2020 | Lofgreen et al. | |
| 2020/0343160 A1 | 10/2020 | Mizerak et al. | |
| 2020/0350233 A1 | 11/2020 | Mizerak et al. | |
| 2020/0352053 A1 | 11/2020 | Mizerak et al. | |
| 2020/0395313 A1 | 12/2020 | Mallik et al. | |
| 2021/0066164 A1 | 3/2021 | Wu et al. | |
| 2021/0175143 A1 | 6/2021 | Yu et al. | |
| 2021/0183741 A1 | 6/2021 | Jha et al. | |
| 2021/0193548 A1 | 6/2021 | Wan et al. | |
| 2021/0193620 A1 | 6/2021 | Refai-Ahmed et al. | |
| 2021/0280497 A1 | 9/2021 | Brun et al. | |
| 2021/0288037 A1 | 9/2021 | Tao et al. | |
| 2021/0378106 A1 | 12/2021 | Iyengar et al. | |
| 2021/0378139 A1 | 12/2021 | Rice et al. | |
| 2021/0410329 A1 | 12/2021 | Yang et al. | |
| 2022/0037231 A1 | 2/2022 | Hsiao et al. | |

(56) References Cited

U.S. PATENT DOCUMENTS

| | | |
|---|---|---|
| 2022/0087059 A1 | 3/2022 | Sathyamurthy et al. |
| 2022/0117115 A1 | 4/2022 | Malouin et al. |
| 2022/0130734 A1 | 4/2022 | Chiu et al. |
| 2022/0189850 A1 | 6/2022 | Liff et al. |
| 2022/0210949 A1 | 6/2022 | Edmunds et al. |
| 2022/0230937 A1 | 7/2022 | Malouin et al. |
| 2022/0408592 A1 | 12/2022 | Malouin et al. |
| 2023/0048500 A1 | 2/2023 | Malouin et al. |
| 2023/0154828 A1* | 5/2023 | Haba ............... H01L 21/187 257/714 |
| 2023/0156959 A1 | 5/2023 | Malouin et al. |
| 2023/0207474 A1 | 6/2023 | Uzoh et al. |
| 2023/0245950 A1* | 8/2023 | Haba ............... H01B 80/00 257/713 |
| 2023/0284421 A1 | 9/2023 | Malouin et al. |
| 2023/0298969 A1 | 9/2023 | Park et al. |
| 2024/0038633 A1 | 2/2024 | Haba et al. |
| 2024/0203823 A1* | 6/2024 | Uzoh ............... H01L 25/18 |
| 2024/0222222 A1 | 7/2024 | Haba et al. |
| 2024/0222226 A1 | 7/2024 | Haba |
| 2024/0249995 A1 | 7/2024 | Haba |
| 2024/0249998 A1 | 7/2024 | Gao et al. |
| 2024/0266255 A1 | 8/2024 | Haba et al. |

FOREIGN PATENT DOCUMENTS

| | | |
|---|---|---|
| CN | 111128976 A | 5/2020 |
| CN | 115719735 A | 2/2023 |
| DE | 10315225 A1 | 10/2004 |
| JP | 2000-340727 A | 12/2000 |
| KR | 10-1049508 B1 | 7/2011 |
| KR | 10-2023-0136509 A | 9/2023 |
| TW | 200834871 A | 8/2008 |
| WO | 2013/097146 A1 | 7/2013 |

OTHER PUBLICATIONS

Francisco Pires, "TSMC Exploring On-Chip, Semiconductor-Integrated Watercooling", tom's Hardware, retrieved from https://www.tomshardware.com/news/tsmc-exploring-on-chip-semiconductor-integrated-watercooling, Jul. 13, 2021, 23 pages.
IBM, "Functional electronic packaging—Thermal management roadmap", available online at <https://web.archive.org/web/20170220095511/https://www.zurich.ibm.com/st/electronicpackaging/cooling.html>, Feb. 20, 2017, 7 pages.
International Search Report and Written Opinion received for PCT Patent Application No. PCT/US23/28942, mailed on Nov. 16, 2023, 12 pages.
International Search Report and Written Opinion received for PCT Patent Application No. PCT/US23/84874, mailed on Apr. 22, 2024, 7 pages.
International Search Report and Written Opinion received for PCT Patent Application No. PCT/US23/85801, mailed on Apr. 26, 2024, 8 pages.
International Search Report and Written Opinion received for PCT Patent Application No. PCT/US23/85816, mailed on Apr. 23, 2024, 11 pages.
International Search Report and Written Opinion received for PCT Patent Application No. PCT/US23/86233, mailed on Apr. 26, 2024, 7 pages.
Kaplan, F. et al, "LoCool: Fighting Hot Spots Locally for System Energy Efficiency" IEEE Transactions on Computer-Aided Design of Intergrated Circuits and Systems, 39(4):895-908 (2020).
U.S. Appl. No. 18/129,567, filed Mar. 31, 2023, First Name Inventor: Cyprian Emeka Uzoh, "Embedded Cooling Systems for Device Packages and Methods of Cooling Packaged Devices".
PCT Application No. PCT/US2024/022253, International Search Report and Written Opinion dated Jul. 17, 2024, 14 pages.
Shamsa, M., et al., "Thermal conductivity of diamond-like carbon films", Applied Physics Letters, vol. 89, No. 16, Oct. 20, 2006, pp. 161921-161921-3.
Wu, C. J., et al., "Ultra High Power Cooling Solution for 3D-Ics", 2021 Symposium on VLSI Technology, Jun. 2021, 2 pages.
"KoolMirco Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.
"Single-Phase Direct-to-Chip Liquid Cooling," 6 pages, downloaded from https://jetcool.com/post/single-phase-direct-to-chip-liquid-cooling-microconvective-vs-microchannel-liquid-cooled-cold-plates/ on Mar. 7, 2024.
"Microconvective Liquid Cooling for high power electronics," https://jetcool.com/technology/, downloaded Mar. 7, 2024, 6 pages.
Benson D.A. et al., "Micro-Machined Heat Pipes in Silicon MCM Substrates", Sandia National Laboratories, Sandia Report: SAND97-0100-UC-704, printed Jan. 1997, 17 pages.
International Search Report and Written Opinion mailed Jun. 5, 2024, in International Application No. PCT/US2024/013758, 9 pages.
International Search Report and Written Opinion mailed Mar. 16, 2023, in International Application No. PCT/US2022/050105, 9 pages.
International Search Report and Written Opinion mailed May 30, 2023, in International Application No. PCT/US2023/061494, 9 pages.
Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.
Lien, Y-J, et al., "An Energy-efficient Si-integrated Micro-cooler for High Power and Power-density Computing Applications," 74th Electronic Components and Technology Conference, 2024, pp. 1025-1029.
Walsh, Stephen Michael, "Microjet Impingement Cooling of High Power-Denisty Eletronics," Thesis, submitted May 11, 2018, 93 pages.

* cited by examiner

INTEGRATED COOLING ASSEMBLIES FOR ADVANCED DEVICE PACKAGING AND METHODS OF MANUFACTURING THE SAME

FIELD

The present disclosure relates to advanced packaging for microelectronic devices, and in particular, embedded cooling systems for device packages and methods of manufacturing the same.

BACKGROUND

Energy consumption poses a critical challenge for the future of large-scale computing as the world's computing energy requirements are rising at a rate that most would consider unsustainable. Some models predict that the information, communications and technology (ICT) ecosystem could exceed 20% of global electricity use by 2030, with direct electrical consumption by large-scale computing centers accounting for more than one-third of that energy usage. Cooling costs make up a significant portion of computing center energy requirements as even small increases in operating temperatures can negatively impact the performance of microprocessors, memory devices, and other electronic components.

Thermal dissipation in high-power density chips (semiconductor devices) is also a critical challenge as improvements in chip performance, e.g., through increased gate density and multi-core microprocessors, have resulted in increased power density and a corresponding increase in thermal flux that contributes to elevated chip temperatures. These elevated temperatures are undesirable as they can degrade the chip's operating performance, efficiency, and reliability. Cooling systems used to maintain the chip at a desired operating temperature typically remove heat using one or more heat dissipation devices, e.g., thermal spreaders, heat pipes, cold pipes, and heat sinks. Such cooling systems can suffer from reduced cooling efficiency due to the design and manufacture of system components.

Accordingly, there exists a need in the art for improved energy-efficient cooling systems and methods of manufacturing the same.

SUMMARY

Embodiments herein provide integrated cooling assemblies embedded in advanced device packages. Advantageously, the integrated cooling assemblies increase an internal surface area of a cold plate across which a coolant fluid flows while controlling the property and flow characteristics of the coolant fluid as it flows through the cold plate.

One general aspect includes, a device package comprising an integrated cooling assembly. The integrated cooling assembly comprises a semiconductor device and a cold plate attached to the semiconductor device. The cold plate comprises a top portion and a bottom portion horizontally adjacent to the top portion. The top portion comprises upper cavity dividers extending downwardly to define upper cavity volumes. The bottom portion comprises lower cavity dividers extending upwardly to define lower cavity volumes. The upper cavity dividers and the lower cavity dividers alternate across a horizontal length of the cold plate.

In some embodiments, the upper cavity dividers and the lower cavity dividers may be disposed across the horizontal length of the cold plate with a lateral spacing between horizontally adjacent upper and lower cavity dividers.

In some embodiments, the upper cavity dividers may be spaced horizontally across the top portion at a first lateral spacing and the lower cavity dividers may be spaced horizontally across the bottom portion at a second lateral spacing different to the first lateral spacing. The lateral spacings between the cavity dividers may be greater than a horizontal width of the cavity dividers.

Another general aspect includes a device package. The device package comprises an integrated cooling assembly. The integrated cooling assembly comprises a semiconductor device and a cold plate attached to the semiconductor device. The cold plate is spaced apart from the semiconductor device to collectively define a coolant chamber volume therebetween. The cold plate comprises a top portion having upper cavity dividers extending downwardly to define upper cavity volumes. A backside of the semiconductor device comprises lower cavity dividers extending upwardly to define lower cavity volumes. The upper cavity dividers and the lower cavity dividers alternate across a horizontal length of the cold plate.

Another general aspect includes a method of manufacturing a device package. The method comprises directly bonding a first substrate comprising upper cavity dividers defining upper cavities to a second substrate comprising lower cavity dividers defining lower cavities. The bonded first and second substrates form a cold plate with horizontally alternating upper and lower cavity dividers. The upper and lower cavity divider are etched into the first and second substrates with an anisotropic etch process. The method further comprises directly bonding the cold plate to a third substrate comprising a semiconductor device. The method further comprises singulating an integrated cooling assembly comprising the semiconductor device and the cold plate from the bonded first, second and third substrates. The method further comprises sealingly attaching a package cover to the integrated cooling assembly by use of a material layer disposed therebetween. The package cover comprises an inlet opening and an outlet opening. The method further comprises, before or after attaching the package cover to the cold plate, forming openings in the material layer to fluidly connect the inlet opening and the outlet opening to the coolant chamber volume.

BRIEF DESCRIPTION OF THE DRAWINGS

The above and other objects and advantages of the disclosure will be apparent upon consideration of the following detailed description, taken in conjunction with the accompanying drawings, in which.

Figure 1A:
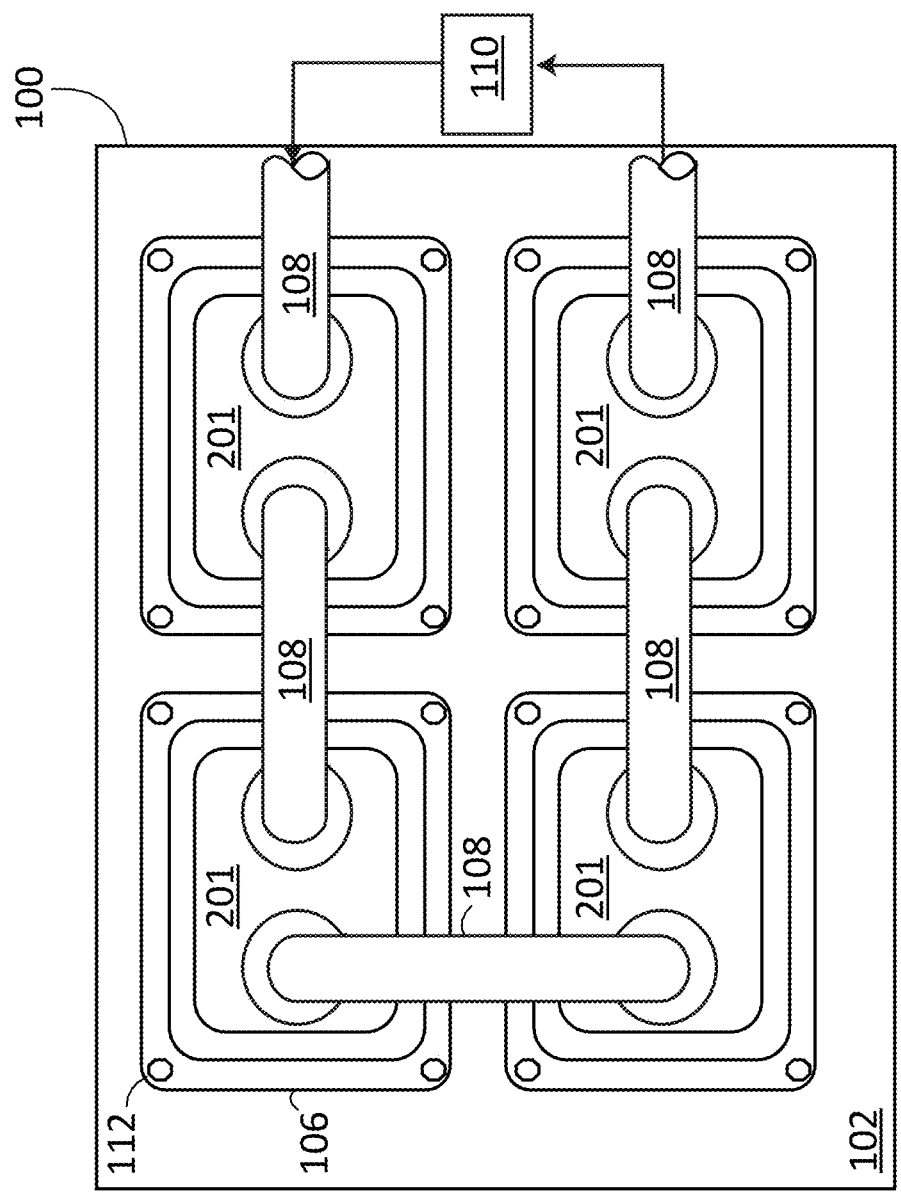
FIG. 1A is a schematic plan view of an example of a system panel, in accordance with embodiments of the disclosure.

The figures herein depict various embodiments of the disclosure for purposes of illustration only. It will be appreciated that additional or alternative structures, assemblies, systems, and methods may be implemented within the principles set out by the present disclosure.

DETAILED DESCRIPTION

Embodiments herein provide for integrated cooling assemblies embedded within a device package. The integrated cooling assemblies increase a surface area of a cold plate across which a coolant fluid flows while controlling the properties and flow characteristics of the coolant fluid as it flows through the cold plate.

As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed. The term substrate also includes "semiconductor substrates" that provide a supporting material upon which elements of a semiconductor device are fabricated or attached, and any material layers, features, and/or electronic devices formed thereon, therein, or therethrough.

As described below, the semiconductor substrates herein generally have a "device side," e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that form the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active" and "non-active sides" are also used to describe surfaces of material layers or features formed on, in, or through the semiconductor substrate, whether or not the material layers or features are ultimately present in the fabricated or assembled device.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower,", "top", "bottom"" and the like are generally made with reference to the X, Y, and Z directions set forth by X, Y and Z axis in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," either alone or in combination with a spatially relevant term include both relationships with intervening elements and direct relationships where there are no intervening elements. Furthermore, the terms "horizontal" and "vertical" are generally made with reference to the X and Z directions set forth in the drawings, respectively.

Unless otherwise noted, the terms "cooling assembly" and "integrated cooling assembly" generally refers to a semiconductor device and a cold plate attached to the semiconductor device. Typically, the cold pate is formed with recessed surfaces that define a fluid cavity (e.g., a coolant chamber volume) between the cold plate and the semiconductor device. The cold plate may comprise a polymer material. The cold plate may be attached to the semiconductor device by use of a compliant adhesive layer 242 or by direct dielectric or hybrid bonding. For example, the cold plate may include material layers and or metal features which facilitate direct dielectric or hybrid bonding with the semiconductor device. Beneficially, the backside of the semiconductor device is directly exposed to coolant fluids flowing through the integrated cooling assembly, thus providing for direct heat transfer therebetween. Unless otherwise noted, the integrated cooling assemblies described herein may be used with any desired fluid, e.g., liquid, gas, and/or vapor-phase coolants, such as water and/or glycol, for example. In some embodiments, the coolant fluids may contain additives to enhance the conductivity of the cooling fluid within the integrated cooling assemblies. The additives may comprise for example, nano-particles of carbon nanotube, nano-particles of graphene, nano-particles of metal oxides. The concentration of these nano-particles may be less than 1%, less than 0.2% and still less than 0.05%. The cooling fluids may also contain small amount of glycol or glycols (e.g. propylene glycol, ethylene glycol etc.) to reduce frictional shear stress and drag coefficient in the cooling fluid within the integrated cooling assembly.

As described below, coolant fluid flowing through a cold plate may be used to control the temperature of semiconductor devices. The fluid flowing across the surface of the semiconductor device absorbs heat and conducts heat away from the device. Unfortunately, the effectiveness of heat transfer from a semiconductor device to the cold plate fluid may be restricted due to dimensions of a cavity in the cold plate (e.g., an amount of surface area exposed to the fluid). Fluid properties and flow characteristics (e.g., turbulence) may also hinder the efficiency of heat transfer.

FIG. 1A is a schematic plan view of an example of a system panel 100, in accordance with embodiments of the disclosure. Generally, the system panel 100 includes a printed circuit board, here PCB 102, a plurality of device packages 201 mounted to the PCB 102, and a plurality of coolant lines 108 fluidly coupling each of the device packages 201 to a coolant source 110. It is contemplated that coolant may be delivered to each of the device packages 201 in any desired fluid phase, e.g., liquid, vapor, gas, or combinations thereof and may flow out from the device package 201 in the same phase or a different phase. In some embodiments the coolant is delivered to the device package 201 and returned therefrom as a liquid and the coolant source 110 may comprise a heat exchanger or chiller to maintain the coolant at a desired temperature. In other embodiments, the coolant may be delivered to the device packages 201 as a liquid, vaporized to a liquid within the device package, and returned to the coolant source 110 as a vapor. In those embodiments, the device packages 201 may be fluidly coupled to the coolant source 110 in parallel and the coolant source 110 may include or further include a compressor (not shown) for condensing the received vapor to a liquid form.

Figure 1B:
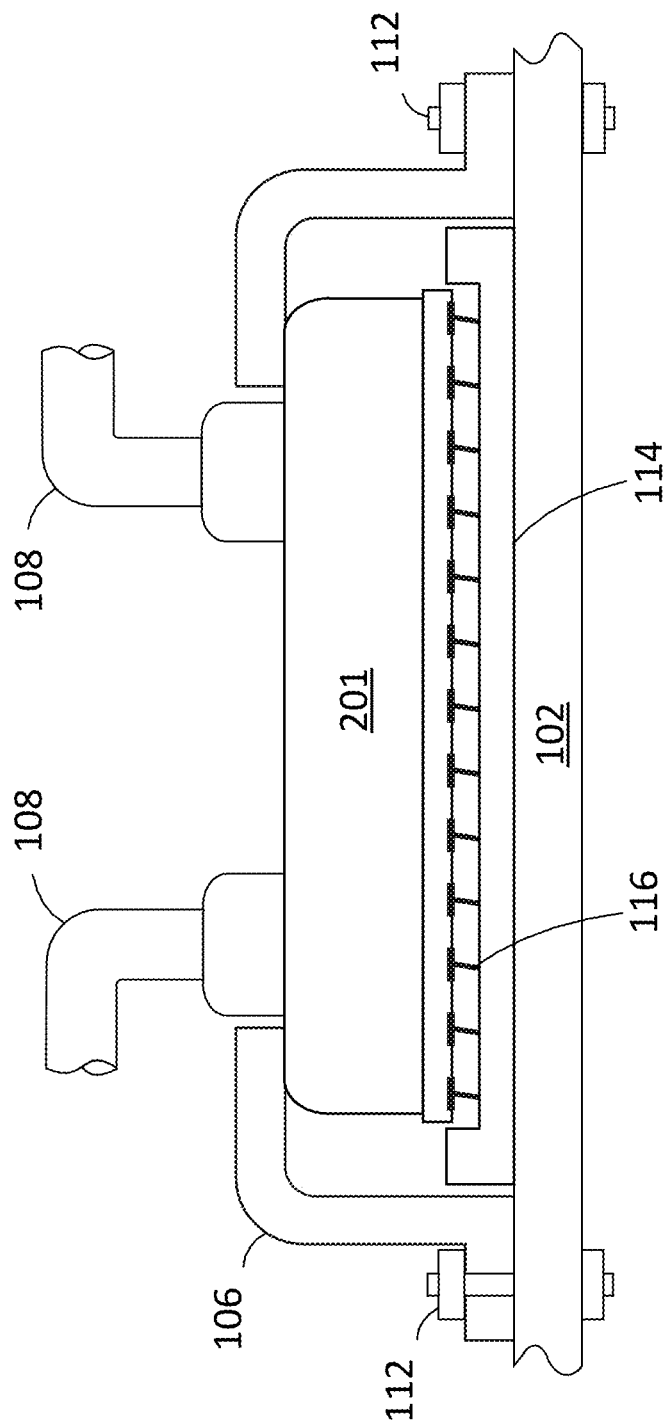
FIG. 1B is a schematic partial sectional side view of a device package mounted on a PCB, in accordance with embodiments of the disclosure.

FIG. 1B is a schematic partial sectional side view of a portion of the system panel 100 of FIG. 1A. As shown, each device package 201 is disposed in a socket 114 of the PCB 102 and connected thereto using a plurality of pins 116, or by other suitable connection methods, such as solder bumps (not shown). The device package 201 may be seated in the socket 114 and secured to the PCB 102 using a mounting frame 106 and a plurality of fasteners 112, e.g., compression screws, collectively configured to exert a relatively uniform downward force on the upward facing edges of the device package 201. The uniform downward force ensures proper pin contact between the device package 201 and the socket 114.

Figure 2A:
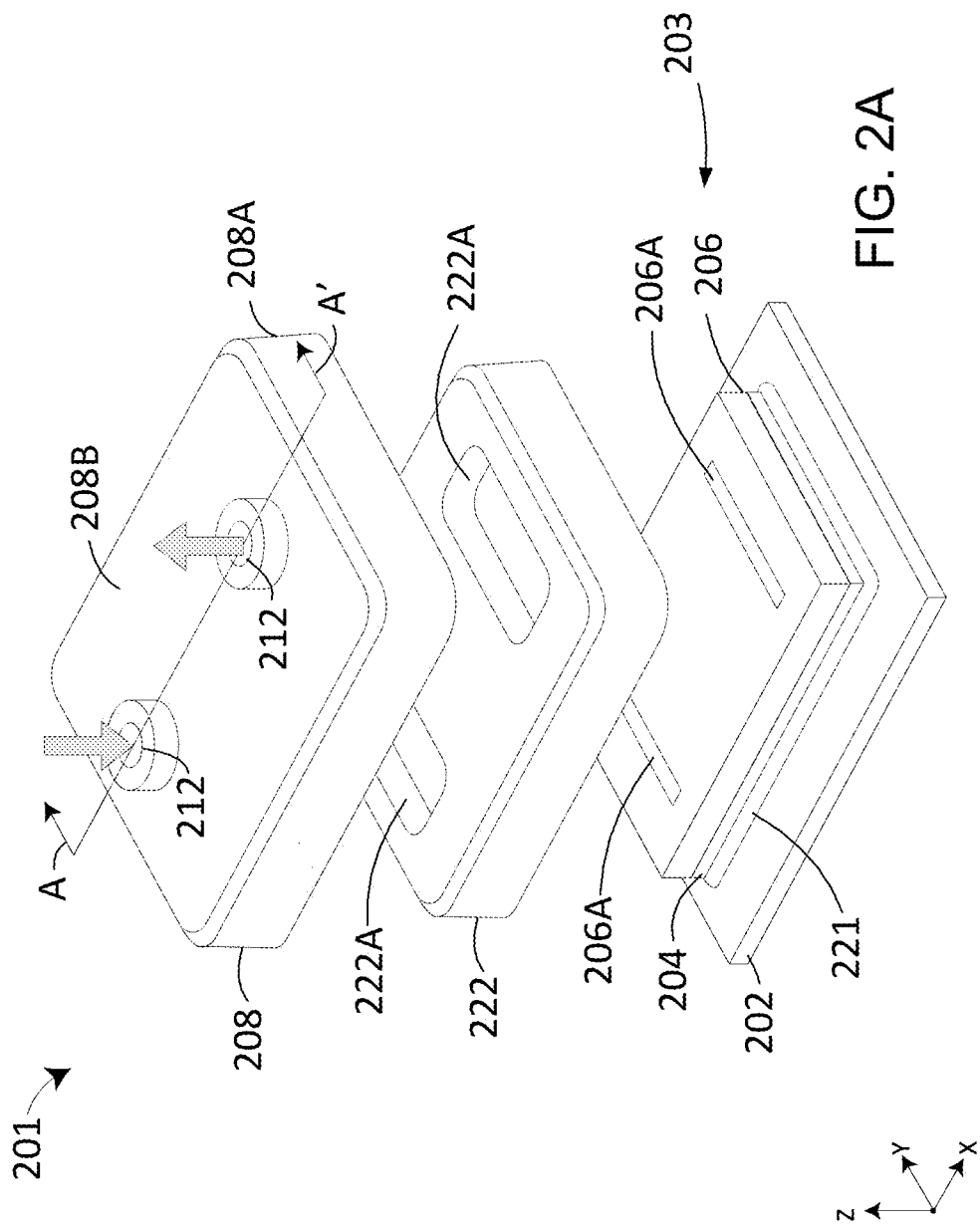
FIG. 2A is a schematic exploded isometric view of the device package in FIG. 1B.
Figure 2B:
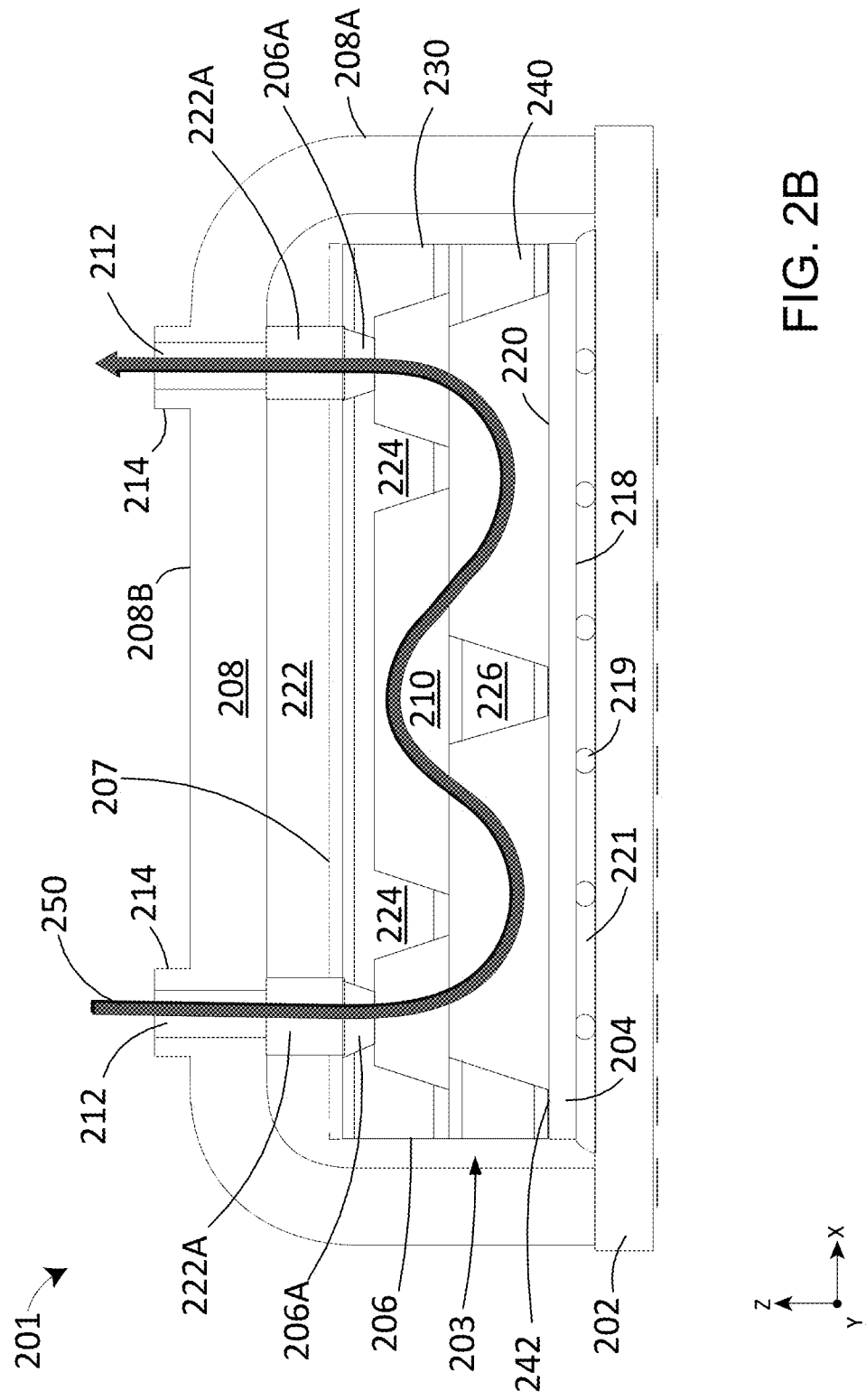
FIG. 2B is a schematic sectional view of the device package of FIG. 1B, in accordance with embodiments of the disclosure.

FIG. 2A is a schematic exploded isometric view of an example device package 201, in accordance with embodiments of the disclosure. FIG. 2B is a schematic sectional view of the device package 201 taken along line A-A' of FIG. 2A. Generally, the device package 201 includes a package substrate 202, an integrated cooling assembly 203 disposed on the package substrate 202, and a package cover 208 disposed on a peripheral portion of the package substrate 202. The package cover 208 extends over the integrated cooling assembly 203 so that the integrated cooling assembly 203 is disposed between the package substrate 202 and the package cover 208. As shown, the device package 201 further includes a sealing material layer 222 that forms a coolant impermeable barrier between the package cover 208 to the integrated cooling assembly 203. Coolant is delivered to the integrated cooling assembly 203 via inlet/outlet openings 212 in the package cover 208 and corresponding openings 222A formed through the sealing material layer 222. In some embodiments, the device package 201 may further include a support member 207 attached to the integrated cooling assembly 203.

Generally, the package substrate 202 includes a rigid material, such as an epoxy or resin-based laminate, that supports the integrated cooling assembly 203 and the package cover 208. The package substrate 202 may include conductive features disposed in or on the rigid material that electrically couple the integrated cooling assembly 203 to a system panel, such as the PCB 102.

The integrated cooling assembly 203 typically includes a semiconductor device, here device 204, and a cold plate 206 bonded to the device 204. Here, the device 204 includes an active side 218 that includes device components, e.g., transistors, resistors, and capacitors, formed thereon or therein, and a non-active side, here the device backside 220, opposite the active side 218. As shown, the active side 218 is positioned adjacent to and facing towards the package substrate 202. The active side 218 may be electrically connected to the package substrate 202 by use of conductive bumps 219, which are encapsulated by a first underfill layer 221 disposed between the device 204 and the package substrate 202. The first underfill layer 221 may comprise a cured polymer resin or epoxy, which provides mechanical support to the conductive bumps 219 and protects against thermal fatigue. The cold plate 206 may be disposed on the package substrate 202 with the semiconductor device 204 attached to the package substrate 202. For example, the semiconductor device 204 may be disposed between the cold plate 206 and the package substrate 202.

As illustrated in FIG. 2B, the cold plate 206 comprises a top portion 230 and a bottom portion 240 vertically adjacent to the top portion 230. For example, the top portion 230 may be stacked on top of the bottom portion 240 in the Z-axis direction such that the top portion 230 is vertically adjacent to a lateral portion 208B of the package cover 208 and the bottom portion 240 is vertically adjacent to the package substrate 202. The top portion 230 comprises upper cavity dividers 224 extending downwardly to define upper cavity volumes 213 (e.g., facing the bottom portion 240). The bottom portion 240 comprises lower cavity dividers 226 extending upwardly to define lower cavity volumes 217 (e.g., facing the top portion 230). As shown, the cold plate 206 has a substantially horizontal orientation, such that the cold plate 206 extends in the X-axis direction. As discussed in more detail below, with reference to FIG. 3A, the upper cavity dividers 224 and the lower cavity dividers 226 may define plural upper and lower cavity volumes, respectively, each having a variety of different shapes, sizes and arrangements. The upper cavity dividers 224 and the lower cavity dividers 226 alternate across a horizontal length of the cold plate 206. The horizontal length may be taken to be the length in the X-axis direction. "Alternate across the horizontal length" may be taken to mean that adjacent pairs of upper cavity dividers 224 are disposed above and on opposite sides of a lower cavity divider 226, and adjacent pairs of lower cavity dividers 226 are disposed below and on opposite sides of an upper cavity divider 224. That is, the cavity dividers are arranged such that downwardly extending upper cavity dividers 224 do not directly oppose (e.g., face) upwardly extending lower cavity dividers 226. Furthermore, the cavity dividers are spaced apart from each other to allow coolant fluid to flow across and between the opposing surfaces of the cavity dividers, as discussed in more detail below. The obstructed coolant flow created by the cavity dividers may be referred to as an irregular flow path (e.g., zigzag flow path) and the obstructed coolant chamber volume 210 may be referred to as an irregular channel.

A "cavity divider" may be taken to be a structure formed for the purpose of dividing an enclosed volume into at least to separate volumes between which fluid may flow (e.g., compartments or sub-volumes).

In some embodiments, the upper cavity dividers 224 and the lower cavity dividers 226 are disposed across the horizontal length of the cold plate 206 with a lateral spacing between adjacent upper and lower cavity dividers. The horizontal length may be taken to be a length of the cold plate 206 which is parallel to the backside 220 of the device 204, for example.

The lateral spacing between adjacent upper and lower cavity dividers provides space through which coolant fluid may flow. For example, as illustrated in FIG. 2B, the top portion 230 comprises two upper cavity dividers 224 and the bottom portion 240 comprises one lower cavity divider 226. The lower cavity divider 226 in the center of the bottom portion 240 is below and adjacent to the two upper cavity dividers 224 in the top portion 230, with lateral spacing therebetween. The lateral spacing between the two upper cavity dividers 224 and the lower cavity divider 226 ensures none of the cavity dividers are in contact with each other and that the coolant fluid is able to flow between the cavity dividers through the cavity volumes.

In some embodiments, the upper cavity dividers 224 are spaced horizontally across the top portion 230 at a first lateral spacing (e.g., in the direction of the X-axis) and the lower cavity dividers 226 are spaced horizontally across the bottom portion 240 at a second lateral spacing (e.g., in the direction of the X-axis) different to the first lateral spacing. The difference between the first and second lateral spacings ensures the upper cavity dividers 224 are offset from the lower cavity dividers. Ensuring the upper and lower cavity dividers are offset from each other prevents the upper and lower cavity dividers from aligning in the Z-axis directs and avoids contact between opposing cavity dividers. Maintaining space between the cavity dividers ensures coolant fluid can flow between the dividers, as discussed above. Here, the first lateral spacing comprises a relatively long space (e.g., 5 mm) between the two upper cavity dividers 224 and a relatively short space (e.g., 2 mm) between each upper cavity divider and an adjacent cold plate sidewall. The second lateral spacing comprises a uniform spacing (e.g., 5 mm) between the lower cavity divider 226 and the cold plate sidewalls on either side.

The minimum spacing between adjacent cavity dividers may be greater than a horizontal width of the cavity dividers themselves. The horizontal width of the cavity dividers may be taken to be widths measured across the widest cross-section of the cavity dividers in a plane parallel to the backside 220 of the device 204 (in the X-axis direction).

Avoiding overlap and vertical alignment of opposing upper and lower cavity dividers ensures coolant fluid is able to flow between cavity dividers.

With reference to FIG. 3, discussed in more detail below, the top portion 230 comprises an upper surface 209 attached to an upper sidewall 211 with the upper sidewall 211 extending downwardly from the upper surface 209. The bottom portion 240 comprises a lower sidewall 216 attached to one of either a lower surface 215 or the backside 220 of the semiconductor device 204. That is, in some embodiments, the lower cavity dividers 226 are disposed directly on the backside 220 of the device 204 with the lower sidewall 216 extending upwardly from the backside 220 of the device 204, as discussed in relation to FIG. 4B below. In such embodiments, the lower surface 215 (and the cold plate 206 as a whole) is attached to the backside 220 of the device 204. In other embodiments, the lower cavity dividers 226 are disposed on the lower surface 215 of the bottom portion 240 with the lower sidewall 216 extending upwardly from the lower surface 215, as discussed in relation to FIG. 4C below.

In order to provide a watertight seal between the top portion 230 and the bottom portion 240, in some embodiment, the upper cavity dividers 224 may extend downwardly from the upper surface 209 to substantially the same depth as a depth of the upper sidewall 211, and the lower cavity dividers 226 may extend upwardly from the lower surface 215 (or backside 220 of the device 204) to substantially the same depth as a depth of the lower sidewall 216. Depth may be taken to be a thickness in the Z-axis direction. In such embodiments, the upper and lower sidewalls meet at a horizontal plane such that upper surfaces of the sidewalls are in contact in the horizontal plane creating a watertight seal between the top portion 230 and the bottom portion 240 (e.g., the upper surfaces of the cavity dividers and sidewalls are coplanar and are vertically aligned in the same plane). The opposing upper surfaces of the cavity dividers (e.g., which are touching when the top portion 230 and the bottom portion 240 are brought together) may be directly bonded together, for example using ZiBond® technology as discussed in more detail below with reference to FIG. 4A. Therefore, in such embodiments, the only means by which coolant fluid may enter and exit the coolant chamber volume 210 is via the openings 206A.

In some embodiments, the upper cavity dividers 224 extend between opposite sides of the upper sidewall 211 to define the upper cavity volumes 213, and the lower cavity dividers 226 extend between opposite sides of the lower sidewall 216 to define the lower cavity volumes 217. As illustrated in FIG. 2B, the top portion 230 may comprise three upper cavity volumes 213 that extend in the Y-axis direction between opposite sides of the upper sidewall 211 (not shown) to form rectangular cavity volumes. Similarly, the bottom portion 240 may comprise two lower cavity volumes 217 that extend in the Y-axis direction between opposite sides of the lower sidewall 216 (not shown) to form rectangular cavity volumes. The upper and lower cavity volumes partially overlap each other to ensure coolant fluid can flow therebetween. It will be understood that the top portion 230 and the bottom portion 240 may comprise more or less cavity dividers than illustrated in FIG. 2B (and therefore more or less cavity volumes than illustrated).

The cavity dividers may be continuous dividers which extend continuously between opposite sides of respective sidewalls, as discussed in relation to FIG. 3A and FIG. 3B below. In some embodiments, the upper cavity dividers 224 are rows of first metal posts and the lower cavity dividers 226 are rows of second metal posts, as discussed in relation to FIG. 4E below.

When attached to the device 204 a coolant chamber volume 210 may be defined, as follows:
  the upper sidewall 211 and the lower sidewalls 216 form a perimeter of the coolant chamber volume 210;
  the upper surface 209 and surfaces of the upper cavity dividers 224 form an uppermost surface of the coolant chamber volume 210; and
  surfaces of the lower cavity dividers and either the backside 220 of the device or the lower surface 215 form the bottom of the coolant chamber volume 210.

Hence, the upper cavity volumes 213 and the lower cavity volumes 217 collectively define the coolant chamber volume 210 therebetween. The coolant chamber volume 210 is in fluid communication with an inlet opening 212 and an outlet opening 212 of the cold plate 206. The backside 220 of the device 204 is in direct thermal contact with coolant fluid flowing through the coolant chamber volume 210, as illustrated by a coolant flow path 250 in FIG. 2B. Beneficially, the lateral spacing between horizontally adjacent upper and lower cavity dividers ensures fluid can flow between the cavities while the cavity dividers themselves serve to interfere with the coolant flow path and create turbulence. Increasing the coolant fluid turbulence improves the efficiency of heat transfer from the backside 220 of the device 204 to the coolant fluid. Moreover, by providing both upper and lower cavity volumes, the surface area of the coolant chamber volume 210 is increased, which further improves the efficiency of heat transfer and overall device 204 cooling. For example, a regular coolant flow path may comprise an unobstructed path (e.g., having no cavity dividers) through the coolant chamber volume 210. The channel through the unobstructed coolant chamber volume 210 may be referred to as a straight channel. A straight channel of 0.5 mm thickness may comprise, for example, 63.32 mm$^2$ of exposed surface area (e.g., silicon). The irregular channel according to embodiment discussed herein, having the same thickness, may comprise 98.64 mm$^2$ of exposed surface area (e.g., silicon), which is an increase of 56% of exposed surface area for heat transfer.

Generally, the support member 207 extends from the upper surface 209 to a bonding interface with the backside 220 of the device 204. The support member 207 may provide structural support to the integrated cooling assembly 203 and disrupts laminar fluid flow at the interface of the coolant and the backside 220 of the device resulting in increased heat transfer therebetween.

Here, coolant is circulated through the cavity volumes in the coolant chamber volume 210 through openings disposed through the cold plate 206, shown here as openings 206A. The openings 206A may be disposed between the downwardly facing upper surface 209 and an opposite upwardly facing surface. The openings 206A are in fluid communication with the inlet/outlet openings 212 of the package cover 208 through openings 222A formed in the sealing material layer 222 disposed therebetween.

As described in the methods below, the cold plate 206 may be etched using an anisotropic etch process that causes surfaces of the upper and lower sidewalls and the upper and lower cavity dividers to slope, i.e., to form an angle of more than or less than 90 degrees with the bonding surface of the device 204. As illustrated in FIG. 4B below, surfaces 402 of the upper cavity dividers 224 slope towards the bottom portion 240 at an angle greater than 90 degrees (e.g., (sidewall) surfaces 402 of the upper cavity dividers 224 extend downwardly towards the bottom portion 240 such that the angle between the upper surface 209 and the (sidewall) surface 402 is greater than 90 degrees). Surfaces 405 of the lower cavity dividers 226 may slope towards the top portion 230 at an angle less than 90 degrees (e.g., (sidewall) surfaces 405 of the lower cavity dividers 226 extend upwardly towards the top portion 230 such that the angle between the backside 220 of the device 204 and the (sidewall) surface 408 is less than 90 degrees), as illustrated in FIG. 2B. It will be understood that, in alternative embodiments, surfaces of the upper and lower cavity dividers may have a different slope. For example, surfaces 405 of the lower cavity dividers 226 may slope towards the top portion 230 at an angle greater than 90 degrees (e.g., (sidewall) surfaces 405 of the lower cavity dividers 226 extend upwardly towards the top portion 230 such that the angle between the backside 220 of the device 204 and the (sidewall) surface 408 is greater than 90 degrees), as discussed in relation to FIGS. 4B-4D below.

The anisotropic etch process causes the upper and lower cavity dividers to have a trapezoidal shape in cross section. For example, the upper cavity dividers 224 may be wider at the upper surface 209 than at their interface with the bottom portion 240. Similarly, the lower cavity dividers 226 may be wider at the lower surface 215/backside 220 of the device 204 than at their interface with the top portion 230 (in embodiments where the angle between the backside 220 of the device 204 and the (sidewall) surface 408 is greater than 90 degrees).

The sloped surface may increase the stability of the upper and lower sidewalls and/or the upper and lower cavity dividers during manufacturing of the integrated cooling assembly 203. The added stability may allow for the width of the upper and lower sidewalls to be narrower, and the coolant chamber volume to be deeper, when compared to cold plates having orthogonal surfaces.

With reference to FIG. 2B, the cold plate 206 is attached to the backside 220 of the device 204 without the use of an intervening adhesive material, e.g., the cold plate 206 may be directly bonded to the backside 220 of the device 204, such that the cold plate 206 and the backside 220 of the device 204 are in direct thermal contact. The package cover 208 generally comprises one or more vertical or sloped sidewall portions 208A and the lateral portion 208B that spans and connects the sidewall portions 208A. The sidewall portions 208A may extend upwardly from a peripheral surface of the package substrate 202 to surround the device 204 and the cold plate 206 disposed thereon. The lateral portion 208B is disposed over the cold plate 206 and is typically spaced apart from the cold plate 206 by a gap corresponding to the thickness of the sealing material layer 222. Coolant is circulated through the coolant chamber volume 210 through the inlet/outlet openings 212 formed through the lateral portion 208B. In each of the embodiments described herein, coolant lines 108 may be attached to the device package 201 by use of connector features formed in the package cover 208, such as threads formed in the sidewalls of the inlet/outlet openings 212 and/or protruding features 214 that surround the openings 212 and extend upwardly from a surface of the lateral portion 208B.

Typically, the package cover 208 is formed of semi-rigid or rigid material so that at least a portion of the downward force exerted on the package cover 208 by the mounting frame 106 (FIG. 1B) is transferred to the supporting surface of the package substrate 202 and not transferred to the cold plate 206 and the device 204 therebelow. In some embodiments, the package cover 208 is formed of a thermally conductive metal, such as aluminum or copper. In some embodiments, the package cover 208 functions as a heat spreader that redistributes heat from one or more electronic components within a multi-component device package.

The sealing material layer 222 forms an impermeable barrier between the integrated cooling assembly 203 and the package cover 208 that prevents coolant from reaching the active side 218 of the device 204 and causing damage thereto. In some embodiments, the sealing material layer 222 comprises a polymer or epoxy material that extends upwardly from the package substrate 202 to encapsulate and/or surround at least a portion of the device 204. In other embodiments, the sealing material layer 222 may be disposed between only the upward facing surface of the cold plate 206 and the portion of the package cover 208 disposed thereover. In some embodiments, the sealing material layer 222 is formed from a molding compound, e.g., a thermoset resin, that when polymerized, forms a hermetic seal between the package cover 208 and the cold plate 206. Here, coolant is delivered to the cold plate 206 through openings 222A disposed through the sealing material layer 222. As shown, the openings 222A are respectively in registration and fluid communication with the inlet/outlet openings 212 of the package cover 208 thereabove and the inlet/outlet openings 206A in the cold plate 206 therebelow. Typically, coolant lines are attached to the device package 201 by use of connector features formed in the package cover 208, such as threads formed in the sidewalls of the inlet/outlet openings 212 and/or protruding features 214 that surround the inlet/outlet openings 212 and extend upwardly from the surface of the lateral portion 208B.

Beneficially, the sealing material layer 222 provides mechanical support that improves system reliability and extends the useful lifetime of the device package 201. For example, the second sealing material layer 222 may reduce mechanical stresses that can weaken interfacial bonds and/or electrical connections between electrical components of the device package 201, such as stresses caused by vibrations, mechanical and thermal shocks, and/or fatigue caused by repeated thermal cycles. In some embodiments, the sealing material layer 222 may be a thermally conductive material, such as a polymer or epoxy having one or more thermally conductive additives, such as silver and/or graphite. In some embodiments, the device package 201 further includes a support member 207 attached to the upward-facing side of the cold plate 206, the support member 207 may be formed of a rigid material, e.g., a metal or ceramic plate, that provides mechanical support to the cold plate 206. The support member 207 may be attached to the cold plate 206 using a direct bonding method or by use of an intervening adhesive layer (not shown).

Figure 3A:
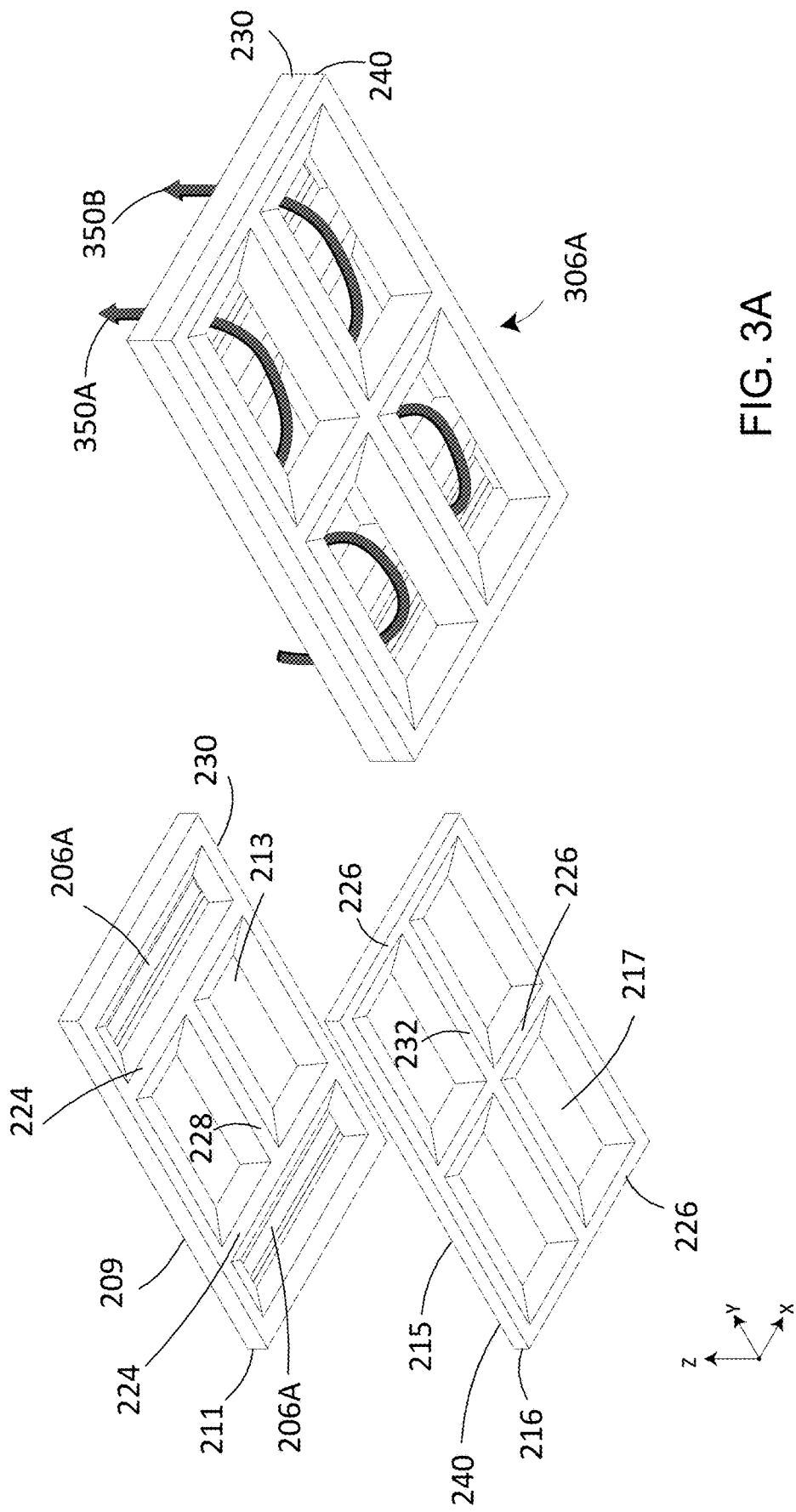
FIG. 3A is a schematic exploded isometric view of a cold plate, in accordance with embodiments of the disclosure.
Figure 3B:
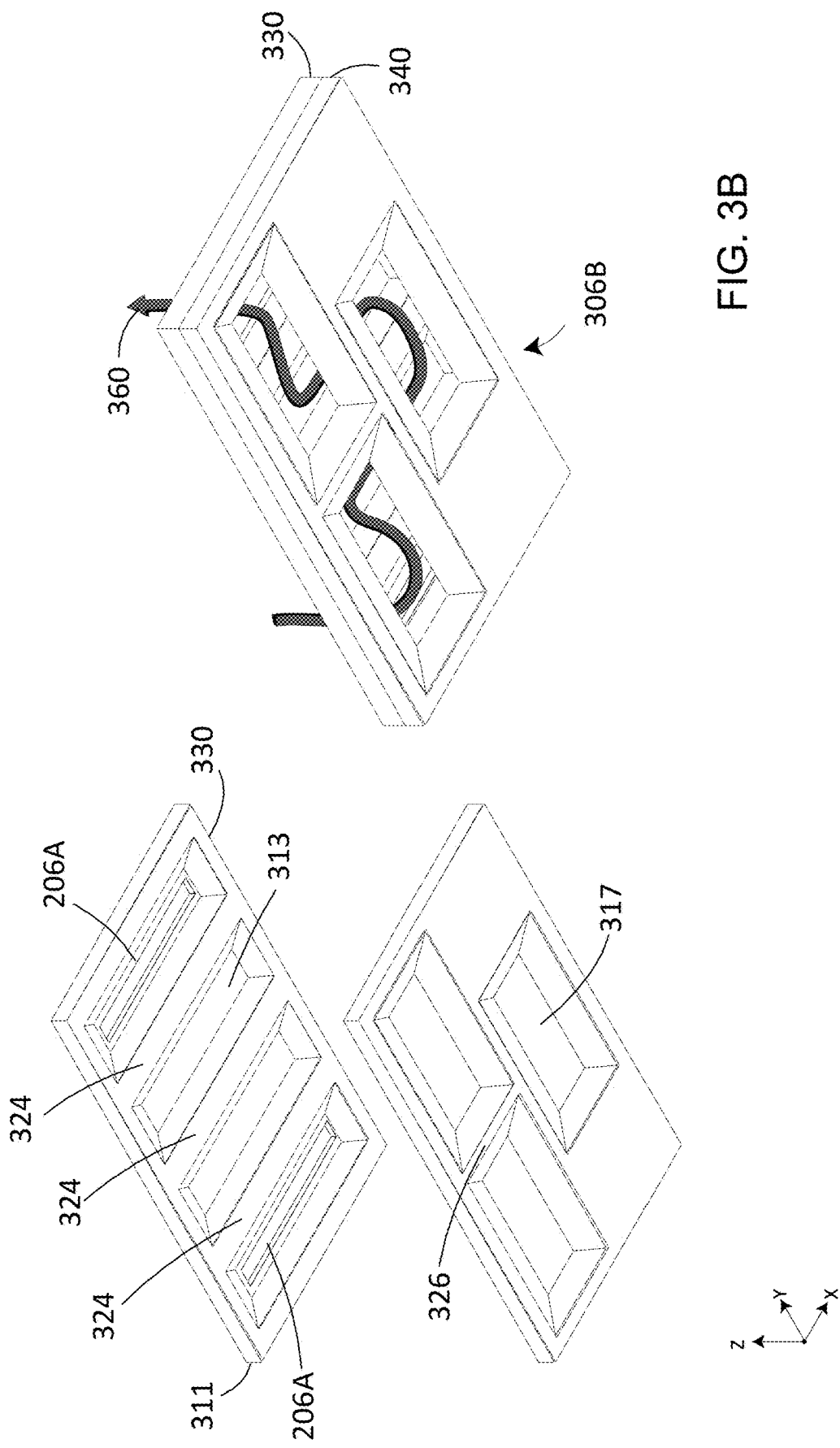
FIG. 3B is another schematic exploded isometric view of a cold plate, in accordance with embodiments of the disclosure.

FIG. 3A and FIG. 3B are schematic exploded isometric views of a cold plate 306A/306B, according to embodiments of the disclosure. In FIG. 3A, the cold plate 306A comprises a top portion 230 and a bottom portion 240, such as described above in relation to FIG. 2B. The top portion 230 may comprise an upper cavity separator 228 attached between a pair of upper cavity dividers 224 to define compartments within a particular upper cavity volume 213. A compartment may be taken to be a sub-section of a cavity volume having the same properties as a cavity volume, but with smaller dimensions. The upper cavity separator 228 therefore defines adjacent rectangular compartments within individual upper cavity volumes 213. The bottom portion 240 may comprises a lower cavity separator 232 attached between a pair of lower cavity dividers 226 to define compartments within a particular lower cavity volume 217. The lower cavity separator 232 therefore define adjacent rectangular compartments within individual lower cavity volumes 217. As shown in FIG. 3A, the top portion 230 may comprise three upper cavity volumes 213 with the middle volume divided into first and second compartments by the upper cavity separator 228. Similarly, the bottom portion 240 may comprise two lower cavity volumes 217 with both volumes divided into first and second compartments by the lower cavity separator 232. Corresponding first compartments of the top portion 230 and the bottom portion 240 define a first irregular channel through the coolant chamber volume 210. Corresponding second compartments of the top portion 230 and the bottom portion 240 (e.g., adjacent to the first compartments) define a second irregular channel through the coolant chamber volume 210. As shown, coolant fluid may flow through the first irregular channel along a first coolant flow path 350A. Coolant fluid may also flow through the second irregular channel along a second coolant flow path 350B. By introducing cavity separators to define two separate coolant flow paths through the same coolant chamber volume 210, the exposed surface area of the cold plate 306A is increased, which increases the efficiency of heat transfer. The cavity sidewalls also create additional obstructions which increases coolant fluid turbulence and further increase the efficiency of heat transfer. While FIG. 3A illustrates a single upper cavity separator 228 and a single lower cavity separator 232, it will be understood that more or less cavity separators may be provided, as discussed below with reference to FIG. 3B.

As shown in FIG. 3B, the cold plate 306B comprises a top portion 330 comprising three upper cavity dividers 324. The cold plate 306B further comprises a bottom portion 340 comprising one lower cavity divider 326. The upper cavity dividers 324 may define two longitudinal upper cavity volumes 313 extending between the upper sidewall 311. The lower cavity dividers 326 may define three longitudinal lower cavity volumes 317 orthogonal to the longitudinal upper cavity volumes 313. A first lower cavity volume may overlap with a first upper cavity volume only, a second lower cavity volume may overlap with a second upper cavity volume only, and a third lower cavity volume may overlap with both the first and the second upper cavity volumes. Such an arrangement of upper and lower cavity volumes defines a three-dimensional irregular channel having a three-dimensional irregular flow path, as illustrated by coolant flow path 360 in FIG. 3B. That is, the coolant flow path 360 directs coolant fluid in X, Y and Z-axis directions in order to increase turbulence and further increase the efficiency of heat transfer. As illustrated in FIG. 3B, the three-dimensional irregular flow path is formed by the third lower cavity divider which is adjacent to both first and second lower cavity dividers and is in fluid communication with both the upper cavity volumes. Function of the openings 206A have been described above, and therefore this description will not be repeated for brevity.

Figure 4A:
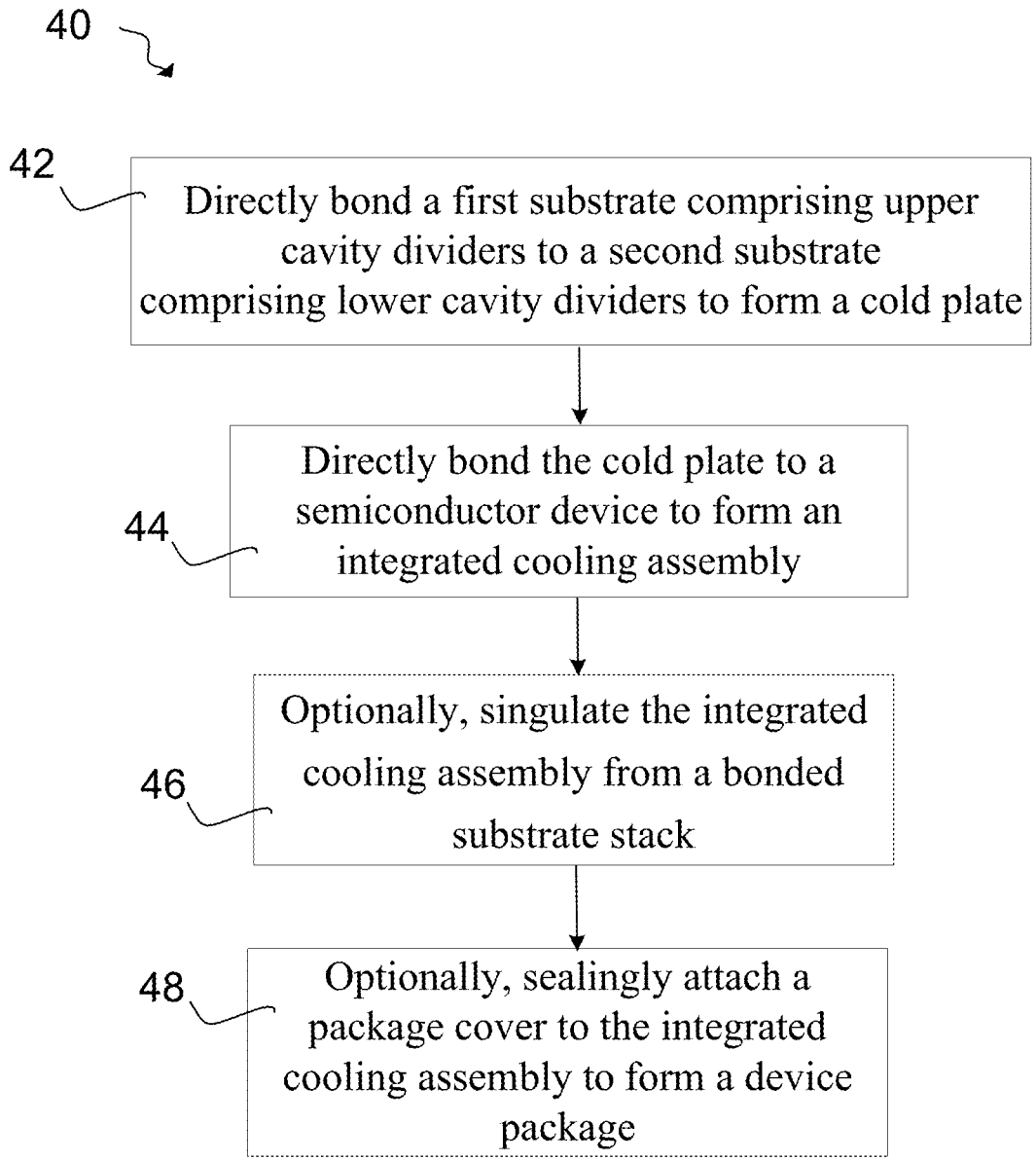
FIG. 4A shows a method that can be used to manufacture the integrated cooling assemblies described herein.
Figure 4B:
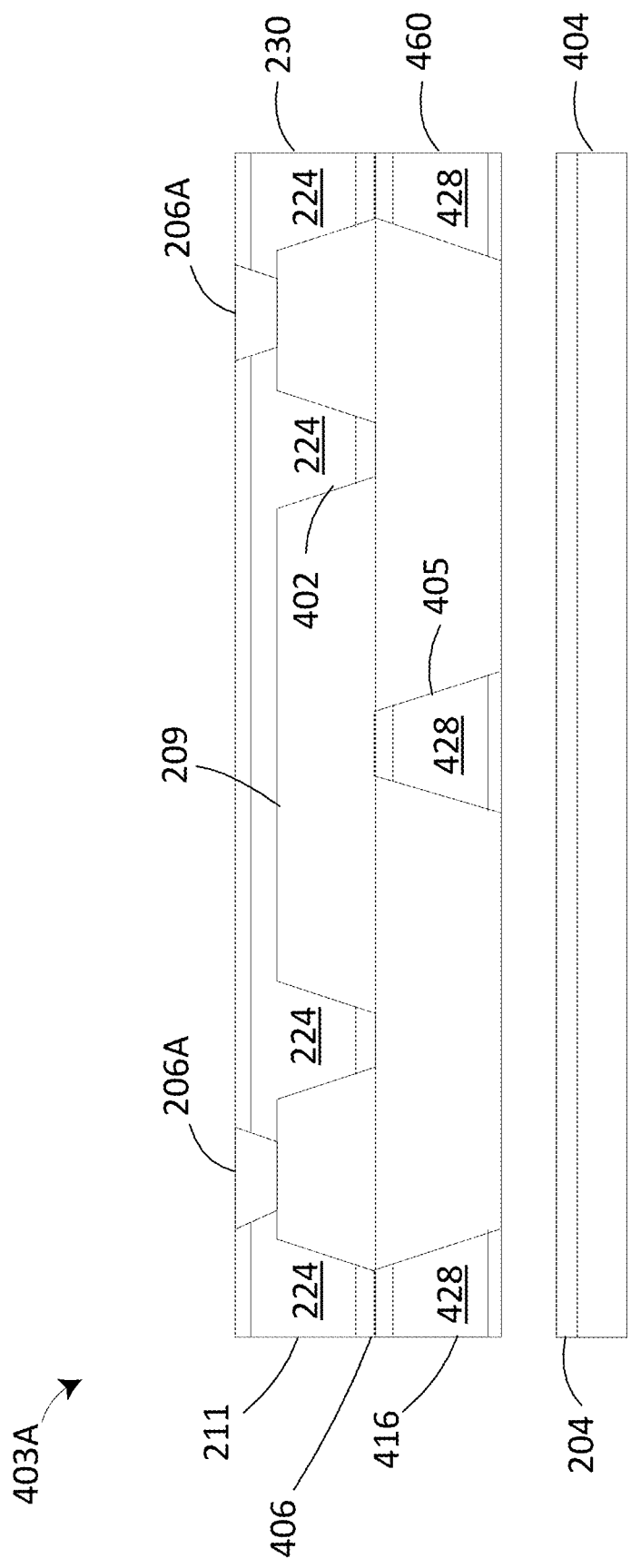
FIG. 4B is a schematic partial sectional side view of an integrated cooling assembly, in accordance with embodiments of the disclosure.

FIG. 4A is a flow diagram setting forth a method 40 of forming an integrated cooling assembly, according to embodiments of the disclosure. FIG. 4B schematically illustrates the integrated cooling assembly 403A formed by the method 40 according to certain embodiments. The integrated cooling assembly 403A of FIG. 4A comprises a first substrate 230, a second substrate 470 and a third substrate 404. The first substrate 230 corresponds to the top portion discussed above and the second substrate 460 corresponds to the bottom portion discussed above.

At block 42, the method 40 includes directly bonding the first substrate 230 (e.g., a monocrystalline silicon wafer) comprising upper cavity dividers 224 defining upper cavity volumes to the second substrate 460 (e.g., a monocrystalline silicon wafer) comprising lower cavity dividers 428 defining lower cavity volumes. The bonded first and second substrates form a cold plate 406 with horizontally alternating upper and lower cavity dividers. The upper and lower cavity volumes are etched into the first and second substrates with an anisotropic etch process. For example, the first and second substrates may be etched using a patterned mask layer formed on surfaces of the respective substrates. The anisotropic etch process uses inherently differing etch rates for the silicon material which is exposed to an anisotropic etchant when the patterned mask layer is formed. In some embodiments, the method 40 further includes etching openings 206A into the first substrate 230.

In FIG. 4B, the upper cavity volumes are etched partially through the first substrate 230 to create upper cavity volumes defined by upper cavity dividers 224, upper sidewalls 211 and an upper surface 209. The depth of the upper cavity volumes may be any depth less than the depth of the first substrate 230 in the X-axis direction (e.g., 50%, 75% or 90% of the depth of the first substrate 230). As discussed above with reference to FIG. 2B, the resulting upper cavity dividers 224 may have surfaces 402 that slope towards the second substrate 460 at an angle greater than 90 degree with respect to the upper surface 209. The lower cavity volumes are etched entirely (or mostly) through the second substrate 460 in FIG. 4B to create lower cavity volumes defined by the lower cavity dividers 428, the lower sidewall 416 and the backside 220 of the device. The depth of the lower cavity volumes may be substantially the same as the depth of the second substrate 460 in the X-axis direction. The arrangement of the first and second substrates in FIG. 4B is such that the resulting lower cavity dividers 428 have surfaces 405 that slope towards the first substrate 230 at an angle greater than 90 degree with respect to the backside 220 of the device 204.

In some embodiments, the etching process is controlled to where the etch rates of the exposed silicon material have a ratio between about 1:10 and about 1:200, such as between about 1:10 and about 1:100, for example between about 1:10 and 1:50, or between about 1:25 and 1:75. Examples of suitable anisotropic wet etchants include aqueous solutions of potassium hydroxide (KOH), ethylene diamine and pyrocatechol (EPD), ammonium hydroxide (HN4OH), hydrazine (N2H4), or tetra methyl ammonium hydroxide (TMAH). The actual differing etch rates depend on the concentration of the etchant in the aqueous solution, the temperature of the aqueous solution, and a concentration of the dopant in the substrates (if any).

Typically, the mask layer is formed of a material which is selective to anisotropic etch compared to the underlying monocrystalline silicon substrate. Examples of suitable mask materials include silicon oxide (SixOy) or silicon nitride (SixNy). In some embodiments, the mask layer has a thickness of about 2 micrometers (μm) or less, such as about 1 μm or less, or about 0.1 μm or less. The mask layer may be patterned using any suitable combination of lithography and material etching patterning methods.

At block 44, the method 40 includes directly bonding the cold plate 406 to the third substrate 404. The third substrate 404 may include a plurality of to-be-singulated die, e.g., devices 204, and the second substrate 460 may include a plurality of to-be-singulated cold plates 406.

An exemplary method for forming the upper and lower cavity volumes as illustrated in FIG. 4B includes: etching the first substrate 230 to form the upper cavity volumes; etching the second substrate 460 to form the lower cavity volumes; bonding the first substrate 230 to the second substrate 470 with the etched surfaces back-to-back (e.g., the second substrate 460 is "flipped" after etching and then bonded with the first substrate 230), and bonding the third substrate 404 to the second substrate on a surface opposite the first substrate 230 to form the integrated cooling assembly 403A.

In other embodiments where the surfaces 405 of the lower cavity dividers 428 slope towards the top portion 230 at an angle less than 90 degrees (e.g., as discussed in relation to FIG. 2B), an exemplary method of forming the upper and lower cavity volumes includes: etch the first substrate 230 to form the upper cavity volumes; bond the first substrate 230 to the second substrate 460 with the upper cavity volumes facing the second substrate 460; etch the second substrate 460 at a surface opposite a surface on which the first substrate 230 is bonded to form the lower cavity volumes; and bond the third substrate 404 to the second substrate on the surface opposite the first substrate 230 to form the integrated cooling assembly.

The third substrate 404 may include a bulk material, and a plurality of material layers disposed on the bulk material. The bulk material may include any semiconductor material suitable for manufacturing semiconductor devices, such as silicon, silicon germanium, germanium, group III-V semiconductor materials, group II-VI semiconductor materials, or combinations thereof. For example, in some embodiments, the third substrate 404 may include a monocrystalline wafer, such as a silicon wafer, a plurality of device components formed in or on the silicon wafer, and a plurality of interconnect layers formed over the plurality of device components. In other embodiments, the substrate may comprise a reconstituted substrate, e.g., a substrate formed from a plurality of singulated devices embedded in a support material.

The bulk material of the third substrate 404 may be thinned after the devices 204 are formed using one or more backgrind, etching, and polishing operations that remove material from the backside. Thinning the third substrate 404 may include using a combination of grinding and etching processes to reduce the thickness (in the Z-direction) to about 450 μm or less, such as about 201 μm or less, or about 150 μm or less. After thinning, the backside may be polished to a desired smoothness using a chemical mechanical polishing (CMP) process, and the dielectric material layer may be deposited thereon. In some embodiments, the dielectric material layer may be polished to a desired smoothness to prepare the third substrate 404 for the bonding process.

In some embodiments, an active side 218 is temporarily bonded to a carrier substrate (not shown) before or after the thinning process. When used, the carrier substrate provides support for the thinning operation and/or for the thinned material to facilitate substrate handling during one or more of the subsequent manufacturing operations described herein.

Here, the method 40 may include forming dielectric layers on the first substrate 230 and the second substrate 260, and directly bonding includes forming dielectric bonds between a first dielectric material layer of the first substrate 230 and a second dielectric material layer of the second substrate 260. Furthermore, the method 40 may include forming dielectric layers on the cold plate 406 and the third substrate 404, and directly bonding includes forming dielectric bonds between a third dielectric material layer of the cold plate 406 and a fourth dielectric material layer of the third substrate 404.

Generally, directly bonding the surfaces (of the dielectric material layers) at blocks 42 and 44 includes preparing, aligning, and contacting the surfaces. Preparing the surfaces may include smoothing the respective surfaces to a desired surface roughness, such as between 0.1 to 3.0 nm RMS, activating the surfaces to weaken or open chemical bonds in the dielectric material, and terminating the surfaces with a desired species. Smoothing the surfaces may include polishing the substrates using a chemical mechanical polishing (CMP) process. Activating and terminating the surfaces with a desired species may include exposing the surfaces to radical species formed in a plasma.

In some embodiments, the plasma is formed using a nitrogen-containing gas, e.g., $N_2$, and the terminating species includes nitrogen and hydrogen. In some embodiments, the surfaces may be activated using a wet cleaning process, e.g., by exposing the surfaces to an aqueous ammonia solution. In some embodiments, the dielectric bonds may be formed using a dielectric material layer deposited on only one of the substrates but not on both. In those embodiments, the direct dielectric bonds may be formed by contacting the deposited dielectric material layer of one substrate directly with a bulk material surface of the other substrate.

Directly forming direct dielectric bonds between the first and second substrates to form the cold plate 406, at block 42, and between the cold plate 406 and the third substrate 404, at block 44, includes bringing the prepared and aligned surfaces into direct contact at a temperature less than 150° C., such as less than 100° C., for example, less than 30° C., or about room temperature, e.g., between 20° C. and 30° C. Without intending to be bound by theory, it is believed that the hydrogen terminating species diffuse from the interfacial bonding surfaces, and chemical bonds are formed between the remaining nitrogen species during the direct bonding process. In some embodiments, the direct bond is strengthened using an anneal process, where the substrates are heated to and maintained at a temperature of greater than about 30° C. and less than about 450° C., for example, greater than about 50° C. and less than about 250° C., or about 150° C. for a duration of about 5 minutes or more, such as about 15 minutes. Typically, the bonds will strengthen over time even without the application of heat. Thus in some embodiments, the method does not include heating the substrates.

After the dielectric bonds are formed, the substrates may be heated to a temperature of 150° C. or more and maintained at the elevated temperature for a duration of about 1 hour or more, such as between 8 and 24 hours, to form direct metallurgical bonds between the metal features. Suitable direct dielectric and hybrid bonding technologies that may be used to perform aspects of the methods described herein include ZiBond® and DBI®, each of which are commercially available from Adeia Holding Corp., San Jose, CA, USA.

At block 46, the method 40 includes singulating an integrated cooling assembly 403A comprising a semiconductor device 204 and the cold plate 406 from the bonded first, second and third substrates.

Singulation after bonding imparts distinctive structural characteristics on the integrated cooling assemblies 203 as the bonding surface of each cold plate 406 has the same perimeter as the backside of the device 204 bonded thereto. Thus, the sidewalls of the cold plate 406 are typically flush with the edges of the device 204 about their common perimeters. In some embodiments, the cold plates 406 are singulated from the first and second substrates using a process that cuts or divides the first and second substrate in a vertical plane (i.e., parallel to the Z-direction). In those embodiments, the sides of the cold plate 406 are substantially perpendicular to the backside of the device 204 (i.e., a horizontal (X-Y) plane of an attachment interface between the device 204 and the cold plate 406). In some embodiments, the cold plates 406 are singulated using a saw or laser dicing process.

At block 48, the method 40 includes sealingly attaching a package cover 208 to the integrated cooling assembly 403A by use of a material layer disposed therebetween (e.g., by use of a molding compound that when cured, forms a sealing material layer 222). The package cover 208 may comprise an inlet opening 212 and an outlet opening 212.

At block 50, the method 40 includes, before or after attaching the package cover 208 to the cold plate 406, forming openings in the material layer to fluidly connect the inlet opening 222A and the outlet opening 222A to the lower cavities and the upper cavities. In some embodiments, the method further includes forming openings 222A in the material layer.

It is contemplated that the methods above are not limited to crystalline silicon as sloped surfaces can be formed using other methods known to those skilled in the art. Thus, in some embodiments, the cold plates 406 may be formed of a bulk material having a substantially similar coefficient of linear thermal expansion (CTE) to the bulk material of the device, where the CTE is a fractional change in length of the material (in the X-Y plane) per degree of temperature change. In some embodiments, the CTEs of the first and second substrates are matched so that the CTE of the second substrate is within about +/-20% or less of the CTE of the first substrate, such as within +/-15% or less, within +/-10% or less, or within about +/-5% or less when measured across a desired temperature range. In some embodiments, the CTEs are matched across a temperature range from about 60° C. to about 100° C. or from about 60° C. to about 175° C. In one example embodiment, the matched CTE materials each include silicon.

Figure 4C:
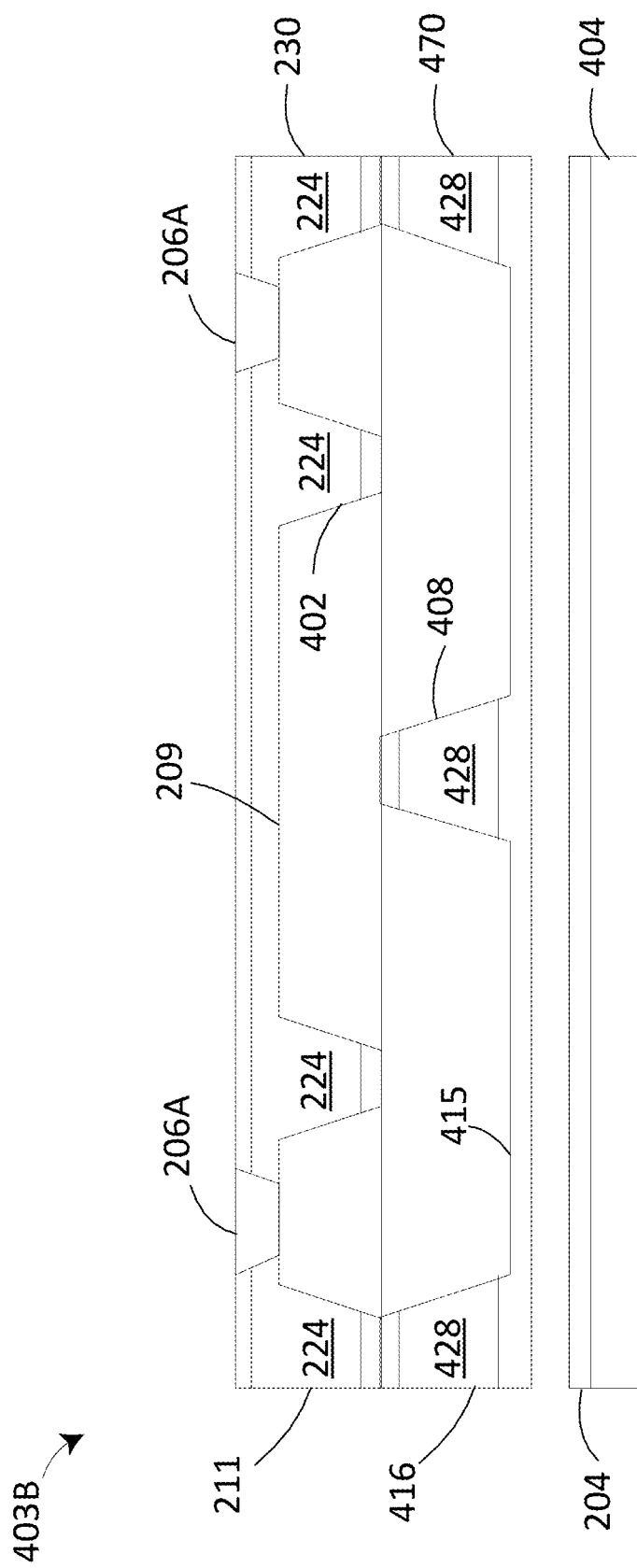
FIG. 4C is another schematic partial sectional side view of an integrated cooling assembly, in accordance with embodiments of the disclosure.

FIG. 4C schematically illustrates an integrated cooling assembly 403B formed by the method 40 according to some embodiments. The integrated cooling assembly 403B of FIG. 4C comprises a first substrate 230, a second substrate 470 and a third substrate 404. The first substrate 230 corresponds to the top portion discussed above and the second substrate 470 corresponds to the bottom portion discussed above.

Here, the upper and lower cavity divider are etched into the first and second substrates with an anisotropic etch process to form a cold plate. The upper cavity volumes are etched partially through a first substrate 230, as discussed above in relation to FIG. 4B. In FIG. 4C, the lower cavity volumes are etched partially through a second substrate 470 to create lower cavity volumes defined by the lower cavity dividers 428, a lower sidewall 416 and a lower surface 415. The depth of the lower cavity volumes may be any depth less than the depth of the second substrate 470 in the X-axis direction (e.g., 50%, 75% or 90% of the depth of the second substrate 470). The arrangement of the first and second substrates in FIG. 4C is such that the resulting lower cavity dividers 428 have surfaces 405 that slope towards the first substrate 230 at an angle greater than 90 degree with respect to the lower surface 415.

The first substrate 230 (e.g., a monocrystalline silicon wafer) comprising upper cavity dividers 224 defining upper cavity volumes is directly bonded to the second substrate 470 (e.g., a monocrystalline silicon wafer) comprising lower cavity dividers 428 defining lower cavity volumes. The bonded first and second substrates form a cold plate with horizontally alternating upper and lower cavity dividers.

An exemplary method for etching the upper and lower cavity volumes as illustrated in FIG. 4C includes: etch the first substrate 230 to form the upper cavity volumes; etch the second substrate 470 to form the lower cavity volumes while maintaining a lower surface 415; bond the first substrate 230 to the second substrate 470 with the etched surfaces back-to-back (e.g., the second substrate 470 is "flipped" after etching and then bonded with the first substrate 230); and bond the third substrate 404 to the second substrate on a surface opposite the first substrate 230 to form the integrated cooling assembly 403B.

Directly bonding the cold plate to the third substrate, singulating 46 the integrated cooling assembly 403B, and forming 50 openings may be the same as discussed above in relation to FIG. 4B, and will therefore be omitted for brevity.

Figure 4D:
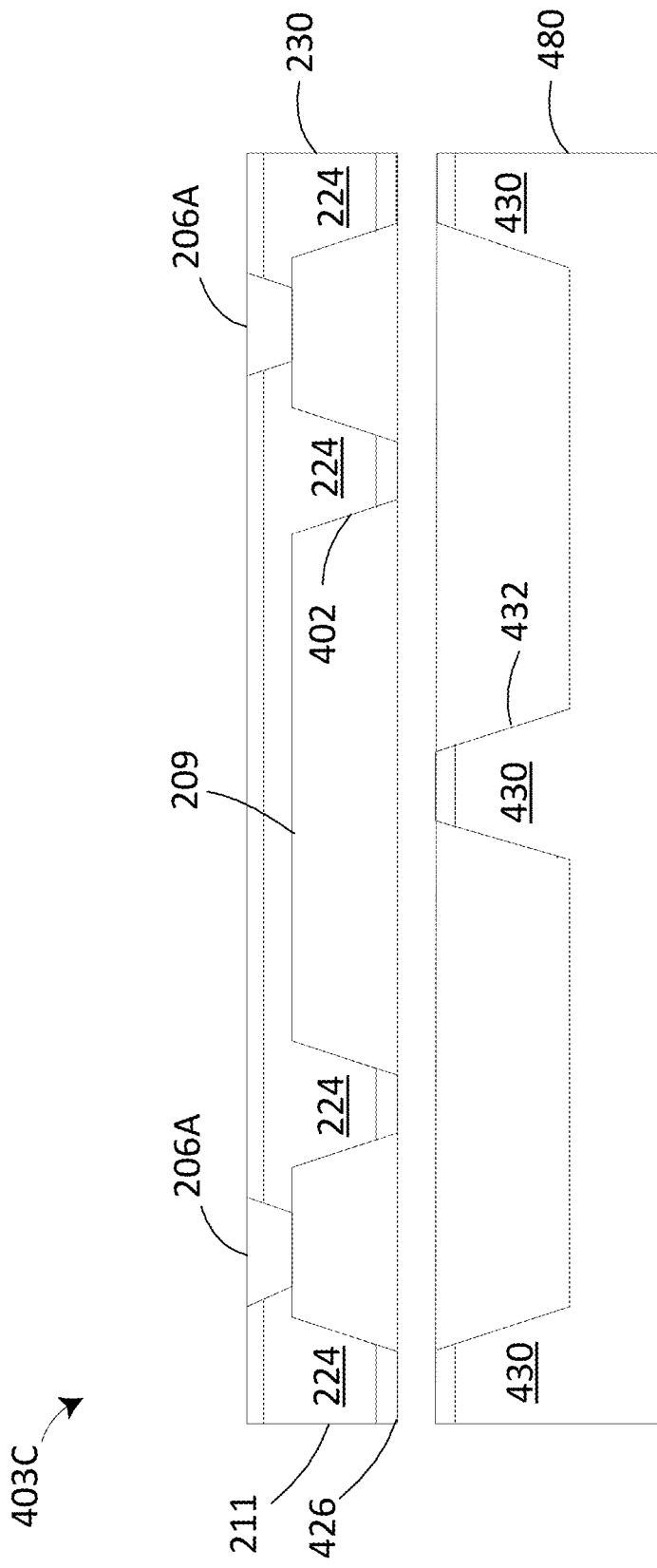
FIG. 4D is another schematic partial sectional side view of an integrated cooling assembly, in accordance with embodiments of the disclosure.

FIG. 4D schematically illustrates an integrated cooling assembly 403C formed by the method 40 according to some embodiments. The integrated cooling assembly 403C of FIG. 4D comprises a first substrate 230 and a second substrate 480. The first substrate 230 corresponds to the top portion discussed above. The second substrate 480 is the substrate of the semiconductor device 204. The second substrate 480 may include a plurality of to-be-singulated die, e.g., devices 204.

Here, the upper cavity divider 224 are etched into the first substrate 230 with an anisotropic etch process. The upper cavity volumes are etched partially through a first substrate 230, as discussed above in relation to FIG. 4B. In FIG. 4D, the lower cavity volumes are etched partially through the second substrate 480 to create lower cavity volumes defined by the lower cavity dividers 430 and an etched backside of the second substrate 480. The depth of the lower cavity volumes may be any depth less than the depth of the second substrate 480 in the X-axis direction (e.g., 50%, 75% or 90% of the depth of the second substrate 480). The arrangement of the first and second substrates in FIG. 4D is such that the resulting lower cavity dividers 430 have surfaces 432 that slope towards the first substrate 230 at an angle greater than 90 degree with respect to the etched backside of the second substrate 480.

The first substrate 230 (e.g., a monocrystalline silicon wafer) comprising upper cavity dividers 224 defining upper cavity volumes is directly bonded to the second substrate 480 (e.g., a monocrystalline silicon wafer) comprising lower cavity dividers 430 defining lower cavity volumes. The first and second substrates are bonded with the etched surfaces back-to-back (e.g., the second substrate 480 is "flipped" after etching and then bonded with the first substrate 230). The upper and lower cavity dividers alternate across a horizontal length to form a cold plate 426.

The method steps of directly bonding the cold plate 426 to the third substrate, singulating 46 the integrated cooling assembly 403C, and forming 50 openings are the same as discussed above in relation to FIG. 4B, and will therefore be omitted for brevity.

Beneficially, in embodiments according to FIG. 4D only a single substrate is required to form the cold plate, because the substrate of the semiconductor device itself is used to form the lower cavity dividers and lower cavity volumes.

In the integrated cooling assembly 403C of FIG. 4D, the cold plate 426 is spaced apart from the semiconductor device 204 to collectively define a coolant chamber volume therebetween. As discussed above, the cold plate 426 comprises the top portion 230 having upper cavity dividers 224 extending downwardly to define upper cavity volumes. The backside 220 of the semiconductor device 204 comprises lower cavity dividers 430 extending upwardly to define lower cavity volumes. The upper cavity volumes of the cold plate 426 and the lower cavity volumes of the semiconductor device 204 define the coolant chamber volume therebetween. The upper cavity dividers 224 and the lower cavity dividers 430 alternate across a horizontal length of the cold plate 206 in the same manner as discussed above.

Figure 4E:
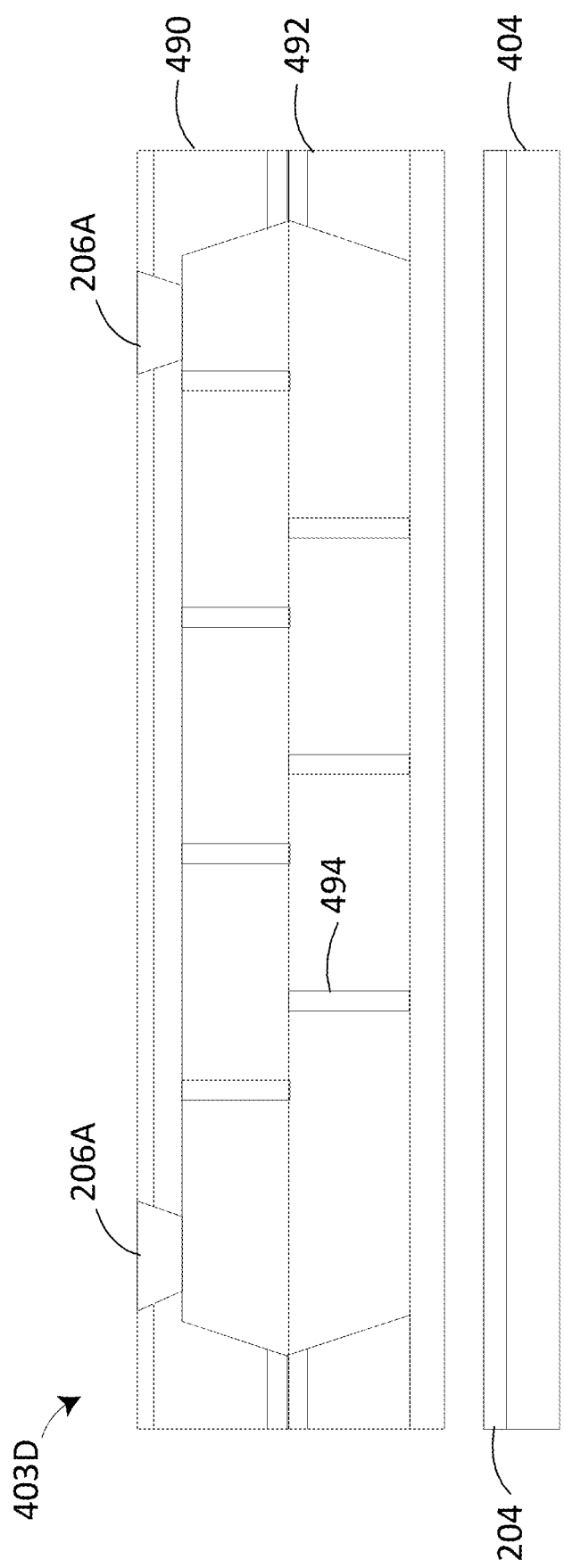
FIG. 4E is another schematic partial sectional side view of an integrated cooling assembly, in accordance with embodiments of the disclosure.

FIG. 4E schematically illustrates an integrated cooling assembly 403D formed by the method 40 according to some embodiments. The integrated cooling assembly 403D of FIG. 4E comprises a first substrate 490 and a second substrate 492, both of which comprise metal posts 494. That is, the first substrate 490 comprises upper metal posts 494 extending downwardly towards the second substrate 492, and the second substrate 492 comprises lower metal posts extending upwardly towards the first substrate 490. The first substrate 490 corresponds to the top portion discussed above and the second substrate 492 corresponds to the bottom portion discussed above. It will be understood that rows of metal posts 494 replace the cavity dividers discussed above in relation to other embodiments.

The rows of metal posts 494 may be arranged with a predetermined spacing therebetween in order that coolant fluid may flow between the metal posts 494. For example, the metal posts 494 may be arranged in a pattern of M rows and N columns, where N and M are positive integers. Such embodiments further increase the exposed surface area of the cold plate 206, which further increases heat transfer efficiency. The metal posts may comprise, for example, aluminum or copper. The metal posts may have a cylindrical or rectangular cross-section. Beneficially, the metal posts may provide structural stability to the cold plate.

The metal posts may be formed in the first and second substrates. Cavity volumes may be etched into the first and second substrates around the metal posts using an etching process which is selective to the metal posts. The cavity volumes may be etched to depths in the first and second substrates as discussed above in relation to the first and second substrates of FIG. 4B.

An exemplary method for forming the upper and lower cavity volumes as illustrated in FIG. 4E includes: selectively etch the first substrate 490 to form cavity volumes around upper metal posts; selectively etch the second substrate 492 to form cavity volumes around the lower metal posts; bond the first substrate 490 to the second substrate 492 with the etched surfaces back-to-back (e.g., the second substrate 492 is "flipped" after etching and then bonded with the first substrate 490); and bond the third substrate 404 to the second substrate on a surface opposite the first substrate 230 to form the integrated cooling assembly.

The method steps of directly bonding the cold plate 426 to the third substrate, singulating 46 the integrated cooling assembly 403D, and forming 50 openings are the same as discussed above in relation to FIG. 4B, and will therefore be omitted for brevity.

Figure 5:
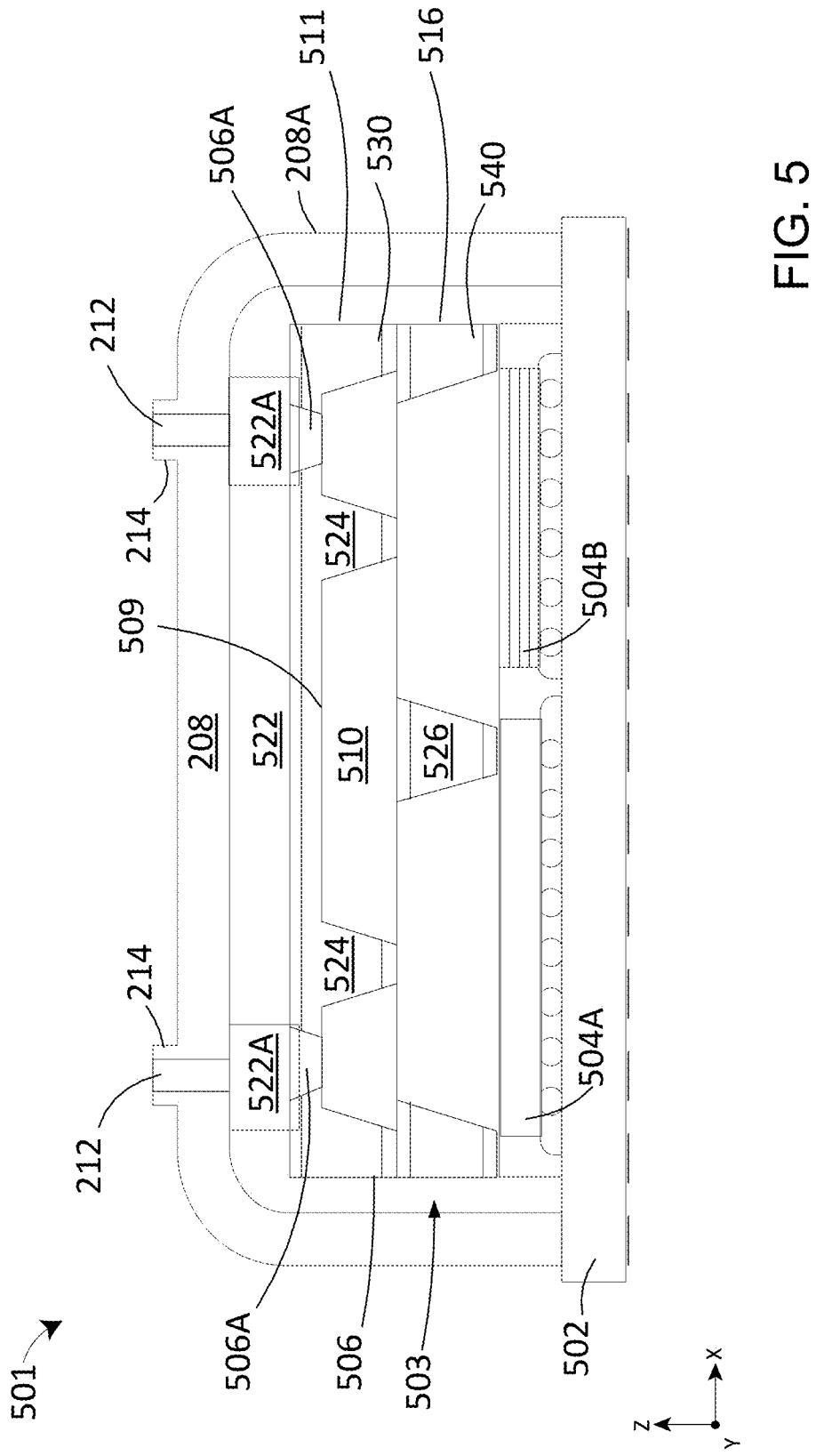
FIG. 5 is a schematic sectional view of a device package, in accordance with embodiments of the disclosure.

FIG. 5 is a schematic side sectional view of an example of a multi-component device package 501 that includes a cold plate 506 directly bonded to the backside surfaces of two or more devices. As shown, the device package 501 includes a package substrate 502, an integrated cooling assembly 503, a package cover 208, and a sealing material layer 522. The integrated cooling assembly 503 may include a plurality of devices 504A (one shown) which may be singulated and/or disposed in a vertical device stack 504B (one shown), and a cold plate 506 attached to each of the devices 504A and device stack 504B, e.g., by the direct bonding methods described herein. In some embodiments, the device 504A may comprise a processor and the device stack 504B may comprise a plurality of memory devices. Here, the device 504A and the device stack 504B are disposed in a side-by-side arrangement on the package substrate 502 and are in electrical communication with one another through conductive elements formed in, on, or through the package substrate 502. Here, the cold plate 506 is sized to provide a bonding surface for attachment to both the device 504A and the device stack 504B but may otherwise be the same or substantially similar to other cold plates described herein. For example, here the cold plate 506 includes a top portion 530 comprising an upper surface 509. Upper sidewall 511 and upper cavity dividers 524 extend downwardly from the upper surface 509 to define upper cavity volumes. The cold plate 506 further comprises lower sidewall 516 and lower cavity dividers 526 that extend upwardly from the device 504A and the device stack 504B to define lower cavity volumes (e.g., the device 504A and the device stack 504B define respective portions of the bottom of the coolant chamber volume 510). The upper and lower cavity volumes collectively define a coolant chamber volume 510. Here, the bottom of the coolant chamber volume 510 and a second underfill layer 540 or other molding material disposed in the gap regions between the device 504A and the device stack 504B provide the intervening bottom portions of the coolant chamber volume disposed between the device 504A and the device stack 504B.

A sealing material layer 522, disposed between the cold plate 506 and package cover 208, attaches the cold plate 506 to the package cover 208 and forms a coolant-impermeable barrier therebetween. Coolant is circulated to the device package 501 through the inlet/outlet openings 212 of the package cover 208 and flows through the coolant chamber volume 510 via openings 506A in the integrated cooling assembly 503 and corresponding openings 522A formed through the sealing material layer 522. Here, the sealing material layer 522 may be formed of a polymer or epoxy molding material, such as described above, or a compliant adhesive layer, such as a thermal interface material (TIM) layer.

The methods described above advantageously improves the efficiency of heat transfer from the backside of a device to a coolant fluid by increasing turbulence in coolant fluid as it passes through the coolant chamber volume. By providing both upper and lower cavity volumes, the surface area of the coolant chamber volume is increased, which also improves the efficiency of heat transfer and overall device cooling. Furthermore, the above described method provides a means for efficiently etching cavities in cold plates for semiconductor devices.

The cold plate and the semiconductor device may be formed of CTE matched materials which eliminate the need for an intervening TIM layer. In some embodiments, the integrated cooling assembly and the package cover may be formed of CTE mismatched materials and attached to one another using a flexible material to form the sealing material layer, or by use of a decoupling adhesive layer disposed between the sealing material layer and one of the cold plate or the package cover. The flexible material may absorb the difference in linear expansion between the package cover and the cold plate during repeated thermal cycles to extend the useful lifetime of the device package.

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the disclosure. Only the claims that follow are meant to set bounds as to what the present disclosure includes.

What is claimed is:

1. A device package comprising:
   an integrated cooling assembly comprising a semiconductor device and a cold plate directly bonded to the semiconductor device by direct dielectric bonds, wherein:
   the cold plate comprises a top portion and a bottom portion vertically adjacent to the top portion;
   the top portion comprises upper cavity dividers extending downwardly to define upper cavity volumes;
   the bottom portion comprises lower cavity dividers extending upwardly to define lower cavity volumes; and
   the upper cavity dividers and the lower cavity dividers alternate across a horizontal length of the cold plate.

2. The device package of claim 1, wherein the upper cavity dividers and the lower cavity dividers are disposed across the horizontal length of the cold plate with a lateral spacing between adjacent upper and lower cavity dividers.

3. The device package of claim 1, wherein:
   the upper cavity dividers are spaced horizontally across the top portion at a first lateral spacing and the lower cavity dividers are spaced horizontally across the bottom portion at a second lateral spacing different to the first lateral spacing; and
   the lateral spacings between the cavity dividers are greater than a horizontal width of the cavity dividers.

4. The device package of claim 1, wherein:
   the top portion comprises an upper surface attached to an upper sidewall, the upper sidewall extending downwardly from the upper surface.

5. The device package of claim 4, wherein the upper cavity dividers extend downwardly from the upper surface to substantially a same depth as a depth of the upper sidewall.

6. The device package of claim 4, wherein the upper cavity dividers extend between opposite sides of the upper sidewall to define the upper cavity volumes.

7. The device package of claim 1, wherein:
   the bottom portion comprises a lower surface attached to a lower sidewall, the lower sidewall extending upwardly from the lower surface; and
   the lower surface is attached to a backside of the semiconductor device.

8. The device package of claim 7, wherein the lower cavity dividers extend upwardly from the lower surface to substantially a same depth as a depth of the lower sidewall.

9. The device package of claim 7, wherein the lower cavity dividers extend between opposite sides of the lower sidewall to define the lower cavity volumes.

10. The device package of claim 1, wherein:
    the bottom portion comprises a lower sidewall extending upwardly from a backside of the semiconductor device; and
    the lower cavity dividers are disposed on the backside of the semiconductor device.

11. The device package of claim 10, wherein the lower cavity dividers extend upwardly from the backside of the semiconductor device to substantially a same depth as a depth of the lower sidewall.

12. The device package of claim 1, wherein:
    the top portion comprises an upper cavity separator attached between a pair of upper cavity dividers to define compartments within the upper cavity volumes, and
    the bottom portion comprises a lower cavity separator attached between a pair of lower cavity dividers to define compartments within the lower cavity volumes.

13. The device package of claim 1, wherein surfaces of the upper cavity dividers slope towards the bottom portion at an angle greater than 90 degrees.

14. The device package of claim 1, wherein:
    surfaces of the lower cavity dividers slope towards the top portion at an angle greater than 90 degrees; or
    surfaces of the lower cavity dividers slope towards the top portion at an angle less than 90 degrees.

15. The device package of claim 1, wherein the upper cavity dividers are rows of first metal posts and the lower cavity dividers are rows of second metal posts.

16. The device package of claim 1, wherein the top portion of the cold plate comprises:
    a package cover, the package cover having an inlet opening and an outlet opening disposed therethrough, and wherein:
    the upper cavity volumes and the lower cavity volumes collectively define a coolant chamber volume therebetween; and
    the coolant chamber volume is in fluid communication with the inlet opening and the outlet opening.

17. The device package of claim 1, wherein:
    the upper cavity dividers define two longitudinal upper cavity volumes;

the lower cavity dividers define three longitudinal lower cavity volumes orthogonal to the longitudinal upper cavity volumes;

a first lower cavity volume overlaps with a first upper cavity volume only;

a second lower cavity volume overlaps with a second upper cavity volume only; and a third lower cavity volume overlaps with both the first and the second upper cavity volumes.

18. A method of manufacturing the device package of claim 1, the method comprising:

directly bond a first substrate comprising the upper cavity dividers defining the upper cavity volumes to a second substrate comprising the lower cavity dividers defining the lower cavity volumes, the bonded first and second substrates forming the cold plate with horizontally alternating upper and lower cavity dividers, wherein the upper and lower cavity dividers are etched into the first and second substrates with an anisotropic etch process; and directly bond the cold plate to a third substrate comprising the semiconductor device.

19. The method of claim 18, further comprising:

sealingly attach a package cover to the integrated cooling assembly by use of a material layer disposed therebetween, the package cover comprising an inlet opening and an outlet opening; and before or after attaching the package cover to the cold plate, form openings in the material layer to fluidly connect the inlet opening and the outlet opening to the lower cavity volumes and the upper cavity volumes.

20. The method of claim 18, wherein the cold plate is attached to the semiconductor device by direct hybrid bonds.

21. The device package of claim 1, wherein the cold plate is attached to the semiconductor device by direct hybrid bonds.

22. The device package of claim 1, wherein:

the upper cavity volumes and the lower cavity volumes collectively define a coolant chamber volume therebetween; and the device package further comprises upper and lower cavity separators to define a plurality of channels through the coolant chamber volume.

23. A device package comprising:

an integrated cooling assembly comprising a semiconductor device and a cold plate directly bonded to the semiconductor device by direct dielectric bonds, wherein:

the cold plate is spaced apart from the semiconductor device to collectively define a coolant chamber volume therebetween;

the cold plate comprises a top portion having upper cavity dividers extending downwardly to define upper cavity volumes;

a backside of the semiconductor device comprises lower cavity dividers extending upwardly to define lower cavity volumes; and the upper cavity dividers and the lower cavity dividers alternate across a horizontal length of the cold plate.

24. The device package of claim 23, wherein:

the device package further comprises upper and lower cavity separators to define a plurality of channels through the coolant chamber volume.

* * * * *